United States Patent
Ohashi et al.

(10) Patent No.: US 6,371,783 B1
(45) Date of Patent: Apr. 16, 2002

(54) SOCKET FOR ELECTRICAL PARTS AND METHOD OF ASSEMBLING THE SAME

(75) Inventors: Yoshiyuki Ohashi; Masami Fukunaga; Kentaro Mori, all of Kawaguchi (JP)

(73) Assignee: Enplas Corporation, Saitama-ken (JP)

( * ) Notice: Subject to any disclaimer, the term of this patent is extended or adjusted under 35 U.S.C. 154(b) by 0 days.

(21) Appl. No.: 09/343,418

(22) Filed: Jun. 30, 1999

(30) Foreign Application Priority Data

Jul. 1, 1998  (JP) ............................................. 10-201154
Aug. 3, 1998  (JP) ............................................. 10-231155
Aug. 5, 1998  (JP) ............................................. 10-233604

(51) Int. Cl.[7] .............................................. H01R 11/22
(52) U.S. Cl. ........................................ 439/268; 439/331
(58) Field of Search ................................ 439/266, 342, 439/265, 267, 268, 330, 331, 72, 71, 73

(56) References Cited

U.S. PATENT DOCUMENTS

| | | | |
|---|---|---|---|
| 4,815,987 A | * 3/1989 | Kawano et al. | 439/263 |
| 5,147,213 A | 9/1992 | Funk et al. | 439/266 |
| 5,254,012 A | 10/1993 | Wang | 439/263 |
| 5,342,213 A | 8/1994 | Kobayashi | 439/268 |
| 5,419,710 A | * 5/1995 | Pfaff | 439/266 |
| 5,562,462 A | * 10/1996 | Matsuba et al. | 439/70 |
| 5,669,780 A | * 9/1997 | Fukunaga | 439/266 |

FOREIGN PATENT DOCUMENTS

| | | |
|---|---|---|
| EP | 0 273 683 A2 | 7/1988 |
| EP | 0 571 105 A1 | 11/1993 |

* cited by examiner

Primary Examiner—Tulsidas Patel
(74) Attorney, Agent, or Firm—Fish & Richardson P.C.

(57) ABSTRACT

In a socket for an IC package as an electrical part, the IC package is mounted on a mount surface of a top plate mounted on a socket body of the socket. A number of contact pins are arranged to the socket body to be contacted to or separated from solder balls of the IC package. A slide plate is disposed to the socket body so as to be movable with respect to the socket body. Each of the contact pins has a pair of elastic pieces formed at front end portions thereof with a pair of contact portions, each of the paired contact portions of the paired elastic pieces being opened or closed in accordance with the movement of the slide plate so as to clamp the solder balls of the IC package thereby electrically being connected thereto. A pre-load plate is located to press a middle portion of the elastic piece of the contact pin arranged to the socket body so as to elastically deform the middle portion thereof along a direction in that the paired contact portions are close to each other.

22 Claims, 28 Drawing Sheets

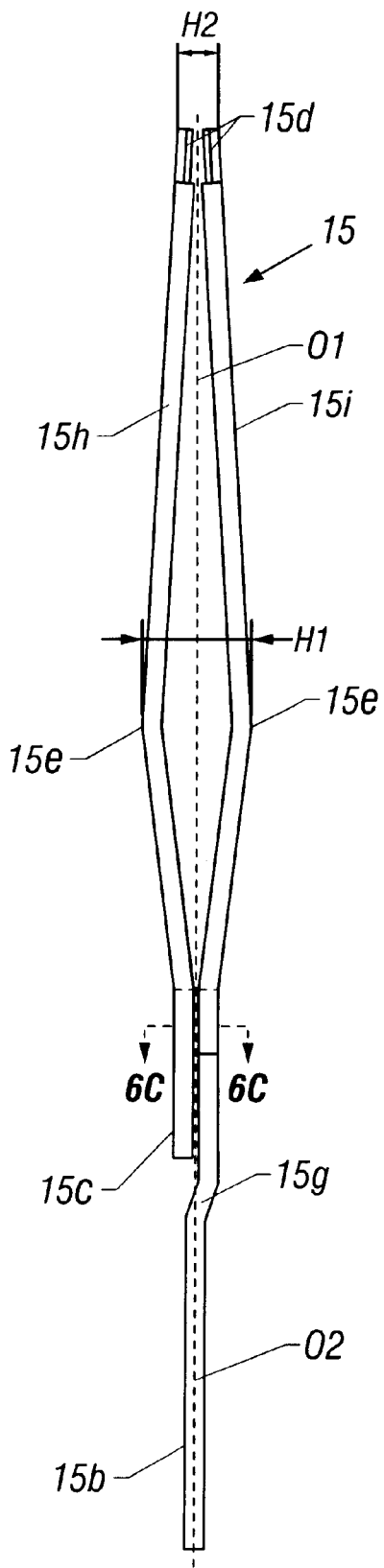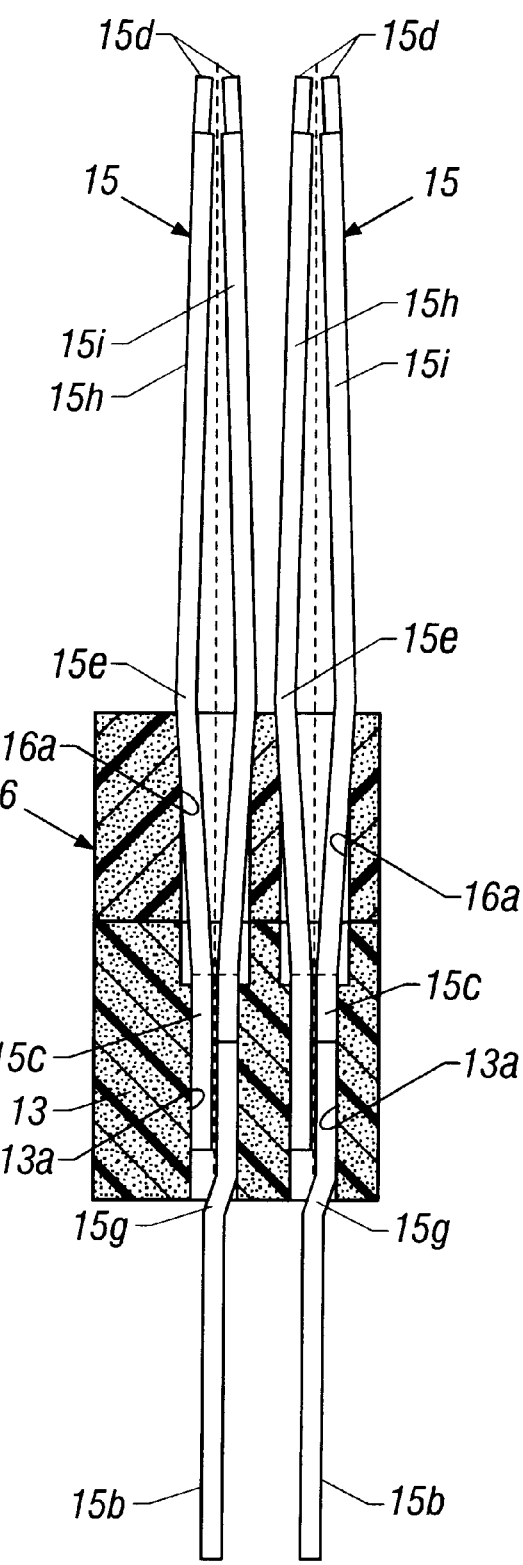
FIG. 6A    FIG. 6C    FIG. 6B

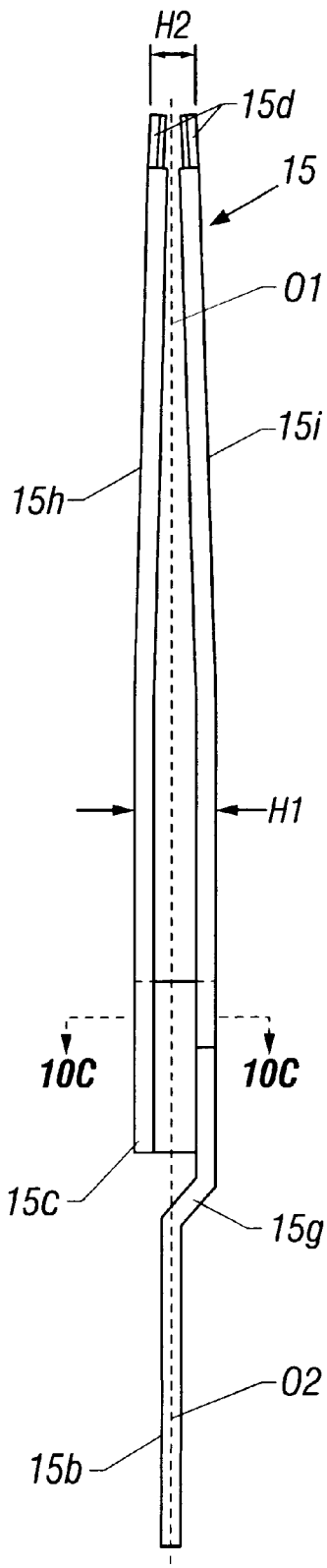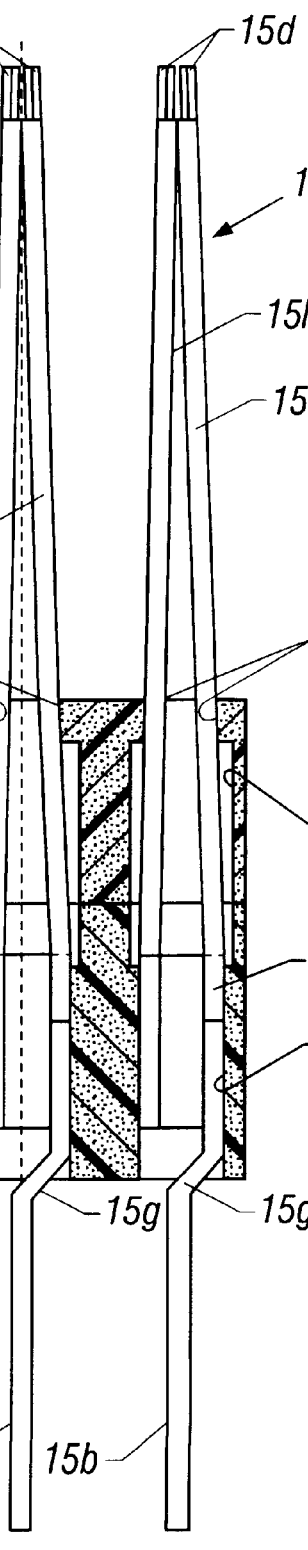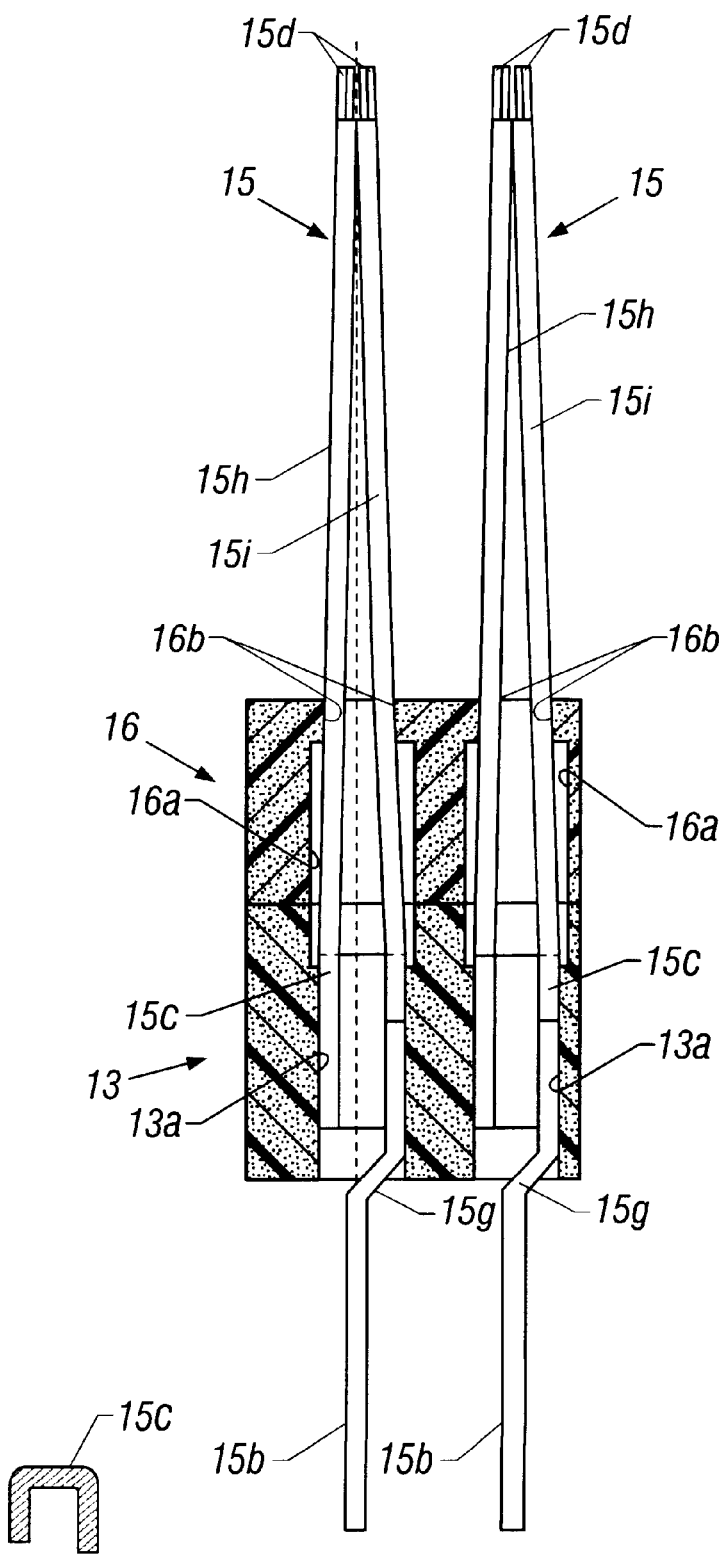
*FIG. 10A*   *FIG. 10C*   *FIG. 10B*

SOCKET FOR ELECTRICAL PARTS AND METHOD OF ASSEMBLING THE SAME

BACKGROUND OF THE INVENTION

1. Field of The Invention

The present invention relates to a socket for electrical parts or components for detachably holding an electrical part such as a semiconductor device (hereinafter, referred to as an IC (Integrated Circuit) package), and also relates to a method of assembling the socket.

2. Description of The Prior Art

In a known art, as a conventional "socket for electrical parts" of this kind, there is provided an IC socket for detachably holding an IC package as "electrical part".

The IC socket is provided with a socket body and a top plate disposed on the socket body so that the IC package is mounted on the top plate. The IC socket is also provided with contact pins detachably contacted to terminals of the IC package and a slide plate arranged between the top plate and the socket body so as to be permitted to horizontally slide. Moreover, an upper operation member is disposed to the socket body so as to be movable vertically (upward and downward) with respect to the socket body.

When the upper operation member is moved downward, the slide plate located at an initial position is horizontally slid so as to elastically deform the contact pins, and a contact portion formed on an upper end of each of the contact pins moves away from an insertion area of the terminals of the IC package. After the contact pin moves away from the insertion area, the IC package is mounted on the top plate, and the upper operation member is moved upward so that the slide plate returns to the initial position, thereby releasing a pressing force against the contact pins. The release of the pressing force causes the contact pin to return an initial position by an elastic force so that contact portion of each of the contact pins contacts to each of the terminals of the IC package so as to be electrically connected thereto.

In these structures of the conventional IC socket, installation and removal of the IC package have been carried out only by sliding horizontally the slide plate without applying insertion and extraction force, making it possible to extremely improve efficiency of the installation and removal of the IC package.

However, in the conventional socket described above, in order to secure a contact pressure of the contact portion of each of the contact pins to each of the terminals of the IC package, it is necessary for each of the contact pins to have comparatively large rigidity. In a case where the contact pins must be arranged on the socket body so that each of the pitches (spaces) between the respective contact pins is narrow, it is necessary to use fine contact pins. Because the fine contact pin does not have sufficient rigidity, there is the possibility that a suitable contact pressure of the contact pin to the terminal of the IC package is not secured. In addition, in order to elastically deform the large number of contact pins each having large rigidity, there is a need of a large operating force for operating the upper operation member.

Furthermore, the contact portion of each contact pin must be arranged at a predetermined position so as to contact to each terminal of the IC package. However, since the contact pin, having long and thin structure, has a lower end disposed to the socket body and the upper end formed with the contact portion contacting to a solder ball, as the terminal of the IC package, a position of the contact portion is instable so that it is hard to arrange the contact portion of the contact pin to the predetermined position.

On the other hand, in this IC socket, the contact pins, which are arranged as an array on the whole, are pressed to fit in the socket body. The slide plate, the top plate and the like are successively laminated and arranged on an upper side of the contact pins.

Each of the plates is formed with through holes, and the upper end portions of the contact pins are inserted in the through holes, respectively.

However, in the conventional IC socket, when plate members, such as the slide plate, the top plate and so on, are assembled to the socket body, the respective upper end portions of the contact pins fitted in the socket body must be inserted in the respective through holes. Therefore, in a case where precision of the spaces between the respective upper end portions of the respective contact pins is deteriorated, it is very hard to carry out the insertion work of the respective contact pins, so that much time for carrying out the insertion work is required.

Especially, because the IC package is getting to rapidly small-sized so that the pitches between the respective terminals are getting to narrow, the pitches between the respective contact pins are getting to narrow. For this reason, the above problems caused by the insertion work of the contact pins are remarkably exposed.

SUMMARY OF THE INVENTION

The present invention is directed to overcome the foregoing problems.

Accordingly, it is an object of the present invention to provide a socket for electrical parts, which is capable of securing a reaction force (contact pressure) by using a thin contact pin and of operating the contact pin by using a small operating force.

It is another object of the present invention is to provide a socket for electrical parts, which is able to arrange a contact portion of a contact pin to a predetermined position.

It is a further object of the present invention is to provide a socket for electrical parts and a method of assembling the socket, which are capable of positioning front end portions of contact pins so that the front end portions thereof are aligned, thereby improving an assembly efficiency of an plate member of the socket.

These and other objects can be achieved according to the present invention by providing, in one aspect, a socket for an electrical part comprising:

a socket body having a mount portion on which an electrical part is mounted, the electrical part having terminals;

a number of contact pins arranged to the socket body and adapted to be contacted to or separated from the terminals of the electrical part, respectively;

a movable plate disposed to the socket body so as to be movable with respect to the socket body, each of the contact pins having an elastic piece formed at a front end portion thereof with a contact portion, the contact portion being displaced in accordance with the movement of the movable plate so as to contact to the terminal of the electrical part, thereby being electrically connected thereto; and a press means for pressing a middle portion of the elastic piece of the contact pin arranged to the socket body so as to elastically deform the middle portion thereof along a direction in that the contact portion are contacted to the terminal of the electrical part.

In a preferred embodiment of this aspect, the press means comprises a press plate having press holes in which the middle portion of the elastic piece is inserted, the press plate being mounted on the socket body, while the middle portion of the elastic piece is inserted in the press hole and the press plate holes pressing the middle portion of the elastic piece so as to elastically deform the middle portion thereof.

The press member is detachably mounted on the socket body or mounted on the socket body integrally.

In another aspect, there is provided a socket for an electrical part comprising:

- a socket body having a mount portion on which an electrical part is mounted, the electrical part having terminals;
- a number of contact pins arranged to the socket body and adapted to be contacted to or separated from the terminals of the electrical part, respectively;
- a movable plate disposed to the socket body so as to be movable with respect to the socket body,
- each of the contact pins having a pair of elastic pieces, formed at front end portions thereof, with a pair of contact portions, each of the paired contact portions of the paired elastic pieces being opened or closed in accordance with the movement of the movable plate so as to clamp each of the terminals of the electrical part, thereby being electrically connected thereto; and
- a press means for pressing a middle portion of each of the elastic pieces of each of the contact pins arranged to the socket body so as to elastically deform the middle portion thereof along a direction in which the paired contact portions are close to each other.

In a preferred embodiment of this aspect, the middle portions of the paired elastic pieces pressed by the press means are formed to be apart from each other at a first predetermined interval while the paired elastic pieces are not subjected to any external force and the contact portions of the paired elastic pieces are formed to be apart from each other at a second predetermined interval, the first predetermined interval being wider than the second predetermined interval.

Each of the paired elastic pieces is provided with a bent portion, the bent portions of the paired elastic pieces are formed at the respective middle portions thereof so that the respective middle portions are bent apart from each other, thereby forming vertex portions of the respective middle portions and said vertex portions of the bent portions are pressed by the press means, respectively. The paired elastic pieces are formed at lower ends with a base portion so that the paired elastic pieces are integrated by the base portion and the base portion is bent so that the paired elastic pieces are opposite to each other. The paired elastic pieces are formed at lower ends with a base portion so as to be integrated by the base portion, each of the contact pins is provided with a solder tail portion extending from the base portion so as to be connected to a printed circuit board and the solder tail portion is formed so that a center line between the paired elastic pieces coincides with a center line of the solder tail portion.

The press means comprises a press plate having press holes in which the middle portions of the elastic pieces are inserted, the press plate being mounted on the socket body, while the middle portions of the elastic pieces are inserted in the press holes, respectively, and the press plate holes presses the middle portions of the elastic pieces so as to elastically deform the middle portions. The press member is detachably mounted on the socket body or mounted on the socket body to be integral.

According to the above aspect of the present invention, because the press means is provided for pressing a middle portion of the elastic piece of the contact pin arranged to the socket body so as to elastically deform the middle portion thereof along a direction in that the paired contact portions are close to each other, it is possible to set displacement amount (press force, pre-load force) for elastically deforming the elastic pieces as desirable amount, thereby setting the contact pressure of the paired contact portions of the contact pin with respect to the terminal. Furthermore, since the contact pins each having a narrow width needless of using contact pins each having large rigidity becomes usable, it is possible to produce the socket having a structure in which each of the pitches between the respective contact pins is narrow and to make small the operation force applied to the contact pins by means of the movable plate.

It is also possible to set the press force (pre-load force) at the paired contact portions large, as compared with a socket having a structure in which the elastic pieces are parallel to each other. Furthermore, since the base portion is bent so that the elastic pieces are opposite to each other, by pressing one plate member by a press working, it is possible to easily produce the contact pin. Since the contact pin is formed in a manner that the solder tail portion is bent at the close portion so that the center line of the elastic pieces coincides with the center line of the solder tail portion, in a case where, for example, the electrical part is carried by an automatic machine so as to be set on one of the sockets mounted on the printed circuit board, it is convenient to coincide both the center lines.

Furthermore, it becomes possible to easily change the pre-load force with respect to the contact pin by only exchanging the press plate to another one of press plates, in which each of another press plates is provided with press holes each having a diameter different from the diameter of each press holes of the press plate.

Since the press means is integrated with the socket body, it is possible to apply the press force (pre-load force) to the contact pin without increasing a number of parts.

In a further aspect of the present invention, there is provided a socket for an electrical part comprising:

- a socket body having a mount portion on which an electrical part is mounted, the electrical part having terminals;
- a number of contact pins arranged to the socket body and adapted to be contacted to or separated from the terminals of the electrical part, respectively;
- a movable plate disposed to the socket body so as to be movable with respect to the socket body,
- each of the contact pins having a pair of elastic pieces formed, at front end portions thereof, with a pair of contact portions, the paired contact portions being opened or closed in accordance with the movement of the movable plate so as to clamp the terminals of the electrical part, thereby being electrically connected thereto; and
- a positioning member arranged close to each of the paired contact portions of each of the paired elastic pieces, each of the positioning members being clamped by the paired elastic pieces and adapted to locate the paired contact portions at a predetermined position.

In a preferred embodiment of this aspect, the socket further comprises a top plate mounted on the socket body, the mount portion being formed on the top plate, and the movable plate is arranged below the top plate.

The socket may further comprises a press means for pressing a middle portion of each of the elastic pieces of each of the contact pins arranged to the socket body so as to elastically deform the middle portion thereof along a direction in that the paired contact portions are contacted to the terminals of the electrical part, respectively.

The middle portions of the paired elastic pieces pressed by the press means are formed to be apart from each other at a first predetermined interval while the paired elastic pieces are not subjected to any external force, and the contact portions of the paired elastic pieces are formed to be apart from each other at a second predetermined interval, the first predetermined interval being wider than the second predetermined interval.

The paired elastic pieces are formed to be tapered towards the contact portion thereof so that the contact portions of the paired elastic pieces are close to each other.

According to the above aspect of the present invention, since a positioning member is arranged close to the paired contact portions of the paired elastic pieces so that the positioning members are clamped by each paired elastic pieces and adapted to locate the paired contact portions at a predetermined position, it is possible to position the contact portions at a predetermined position and to keep proper a positional relationship between the terminals and the contact portions. In addition, because the paired elastic pieces of the contact pin clamp the positioning member, it is possible to set a center of the contact portions.

Furthermore, since pressing means is provided for pressing a middle portion of each of the elastic pieces of the contact pin arranged to the socket body so as to elastically deform the middle portion thereof along a direction in which the paired contact portions are contacted to the terminals of the electrical part, respectively, it is possible to set displacement amount (pre-load force) for elastically deforming the elastic pieces as desirable amount, thereby setting the contact pressure of the paired contact portions of the contact pin with respect to the terminal. In addition, since the contact pin is supplied with the pre-load force, it is possible to make small the operation force applied to the contact pins by means of the movable plate. Furthermore, the contact pin is previously pressed with the paired contact portions to be close, and since the positioning portion is inserted between the paired contact portions, it is possible to prevent the paired contact portions from being interfered.

Still furthermore, the paired elastic pieces are not subjected to any external force, and since the first interval of the middle portions of the paired elastic pieces pressed by the press means are wider than the second interval of the paired contact portions, it is possible to set the pre-load force at the paired contact portions large, as compared with a socket having a structure in which the elastic pieces are parallel to each other.

In a further aspect of the present invention, there is provided a socket for an electrical part comprising:
- a socket body having a mount portion on which an electrical part is mounted, the electrical part having terminals;
- a number of contact pins arranged to the socket body as an array and pressed to fit in the socket body, each of the contact pins having a front end portion;
- a plate member mounted on the socket body, the plate member having a number of holes into which the contact pins are inserted, respectively, the front end portions of the contact pins being contacted to or separated from the terminals of the electrical part, respectively; and
- a positioning member disposed to the socket body to be movable along an extending direction of the contact pin, the positioning member having a number of positioning holes into which the contact pins are inserted, respectively, wherein, after the contact pins are fitted in the socket body, the positioning member is moved towards the front end side of each of the contact pins so as to permit each of the front end portions of each of the contact pins inserted in each of the positioning holes to be located at a predetermined position.

In a preferred embodiment of this aspect, each of the contact pins has a pair of clamp pieces formed, at front end portions thereof, with a pair of contact portions, each of the paired contact portions clamping each of the terminals of the electric part, when the contact pins are pressed to fit in the socket body, each of the paired contact portions of each of the paired clamp pieces is opened, and each of the paired contact portions is elastically deformed towards a direction in that each of the paired contact portions is closed in accordance with the movement of the positioning member towards the contact end side of each of the contact pins.

The plate member is adapted to be movable with respect to the socket body, each of the contact portions of each of the paired clamp pieces being opened or closed in accordance with the movement of the plate member so as to clamp each of the terminals of the electrical part, thereby being electrically connected thereto.

The socket may further comprises a top plate having a number of through holes and mounted on the socket body so that the paired contact portions are inserted in the through holes of the top plate, respectively, the mount portion being formed on the top plate.

According to the above aspect of the present invention, since the positioning member is disposed to the socket body so as to be movable along an extending direction of the contact pin, when the contact pins are pressed to be fitted in the socket body, it is possible to arrange the positioning member at a position such that the contact pins are easily pressed. Furthermore, after the contact pins are fitted in the socket body, since positioning member is moved towards the front end side of each of the contact pins, it is possible to locate the front end portions of the contact pins at a predetermined position. Therefore, it is possible to easily carry out the arrangement work of the contact pins and to improve a precision of spaces between the paired contact portions.

As a result, it is possible to easily assemble the plate member to the socket body, and to make the spaces (pitches) of the paired contact portions narrow.

Furthermore, since the elastically deformation of the paired clam pieces towards the closing direction by the upward movement of the positioning member causes the contact pin to be subjected to a pre-load so that it is possible to secure a contact pressure with respect to the terminal of the electrical part. Furthermore, it becomes possible to use a clamp piece having low rigidity as the clamp piece itself, thus making it possible to provide the socket having a structure in which each of the pitches between the respective contact pins is narrow.

In a still further aspect of the present invention, there is provided a method of assembling a socket having a socket body for an electrical part, comprising the steps of:
- preparing a positioning member having a number of positioning holes, a number of contact pins each of which has a pair of clamp pieces formed, at front end portions thereof, with a pair of contact portions, a plate member having a number of press portions and a top plate having a mount portion on which an electrical part is mounted and a number of through holes;
- disposing the positioning member to the socket body so as to be movable with respect to the socket body; inserting the contact pins in the positioning holes so as to press the contact pins to fit in the socket body;

inserting each of the press portions of the plate member in each of spaces between the paired elastic pieces so as to arrange the plate member on the socket body, the plate member being slidable with the socket body, the paired contact portions of each of the paired elastic pieces being opened or closed in accordance with the movement of the plate member;

moving the positioning member towards the contact portion side of each of the contact pins so as to elastically deform the paired elastic pieces thereby closing the paired contact portions so that the press portions of the plate member are clamped by the paired contact portions, respectively; and inserting the closed contact portions into the through holes of the top plate so as to arrange the top plate on the socket body.

According to this aspect, when the contact pins are pressed to be fitted in the socket body, since the paired clamp pieces are opened, it is possible to easily insert the press portion of the plate member in the paired clamp pieces, thereby improving assembling efficiency of the plate member to the socket body.

The nature and further characteristic features of the present invention may be made more clear from the following descriptions made with reference to the accompanying drawings.

BRIEF DESCRIPTION OF THE DRAWINGS

In the accompanying drawings:

FIG. 6A is a front view showing the contact pin before the contact pin is arranged according to the first embodiment;

FIG. 6B is a cross sectional view showing a state that the contact pins are arranged according to the first embodiment;

FIG. 6C is a cross section view of base portion of contact in FIG. 6A.

FIG. 10A is a front view corresponding to FIG. 6A and showing the contact pin before the contact pin is arranged according to a second embodiment;

10B is a cross sectional view corresponding to FIG. 6B and showing a state that the contact pins are arranged according to the second embodiment;

FIG. 10C is cross section view of base portion of contact in FIG. 10A.

Figure 11:
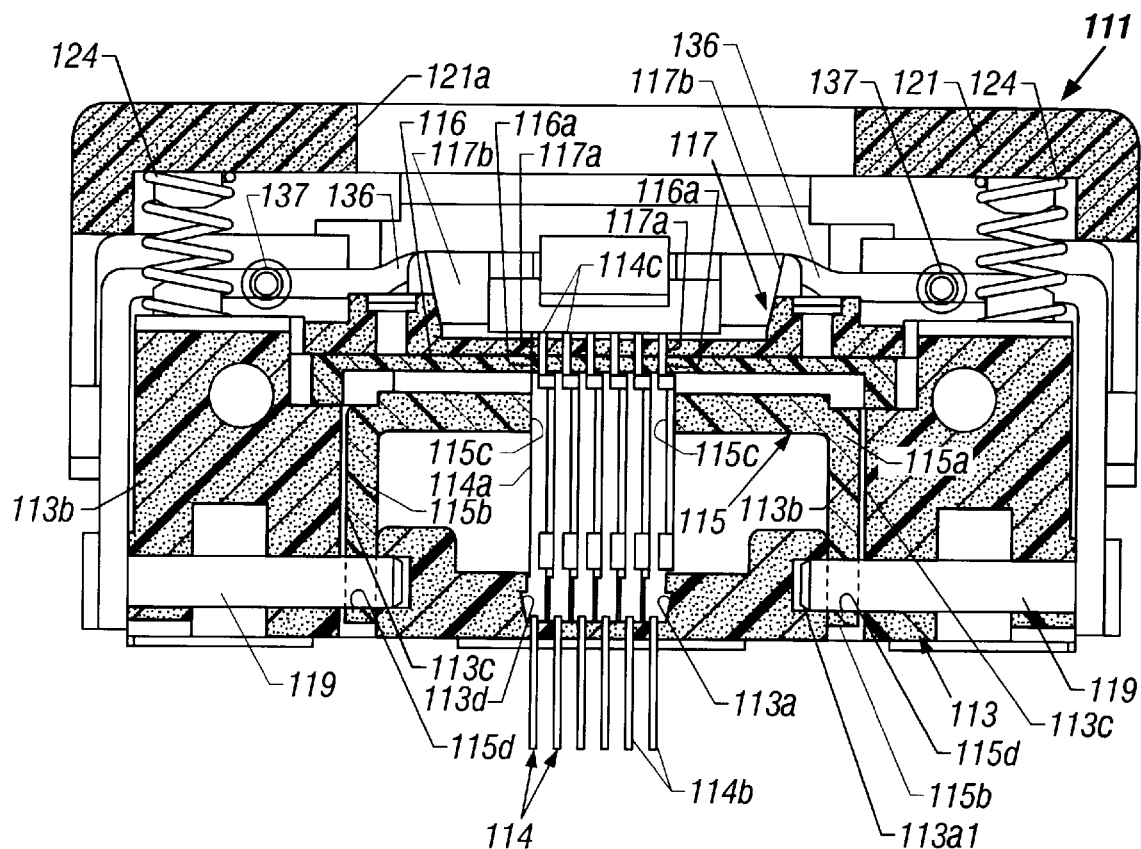
Figure 12:
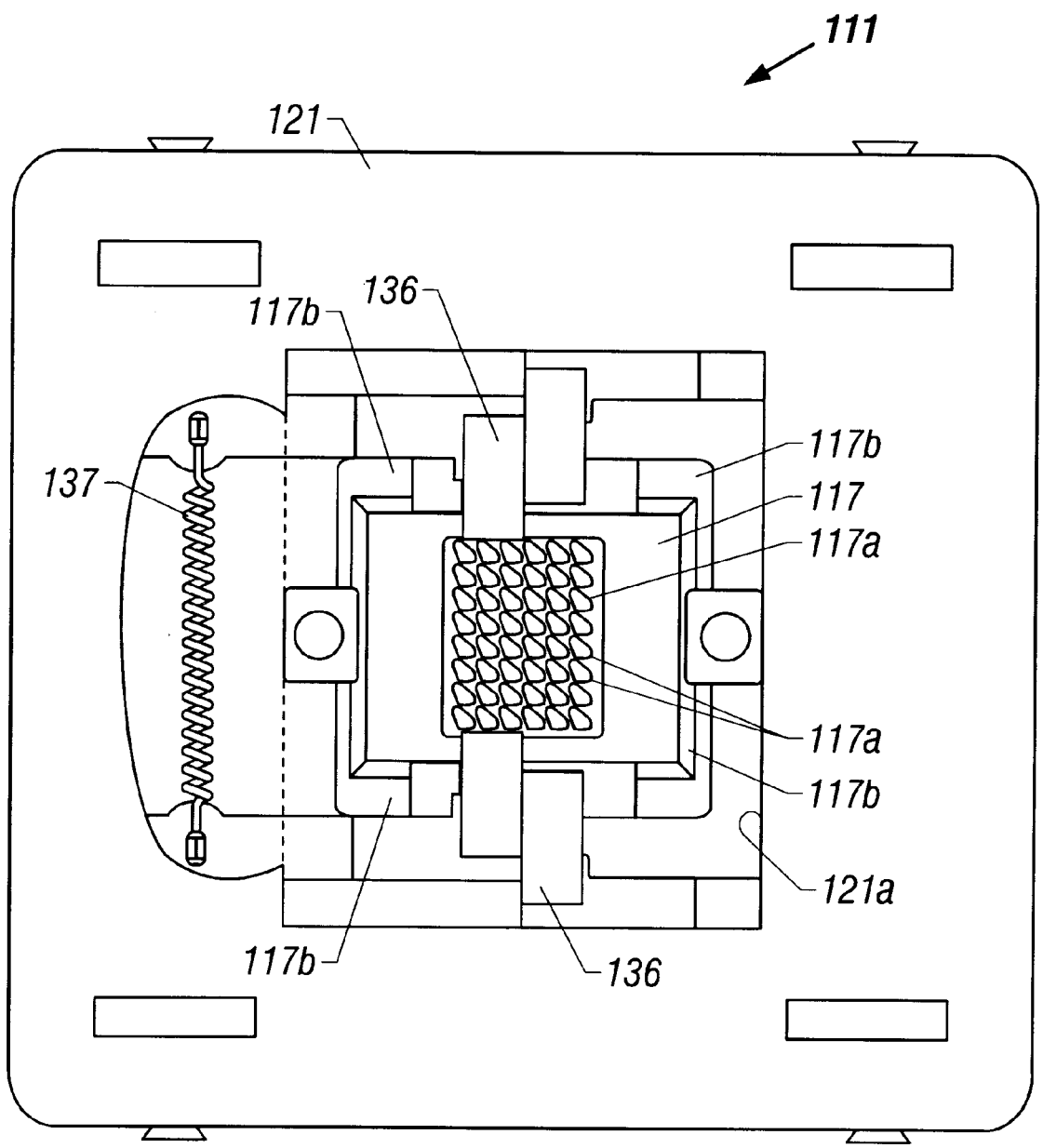
Figure 13:
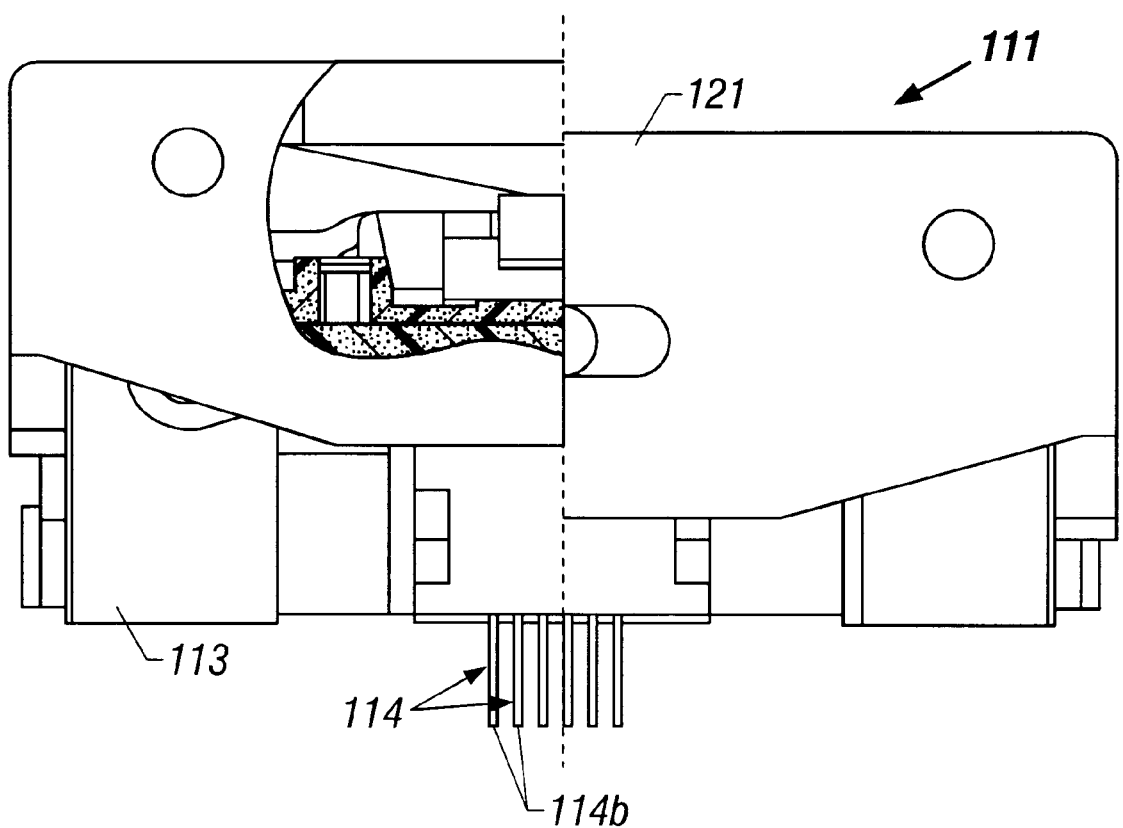
Figure 14:
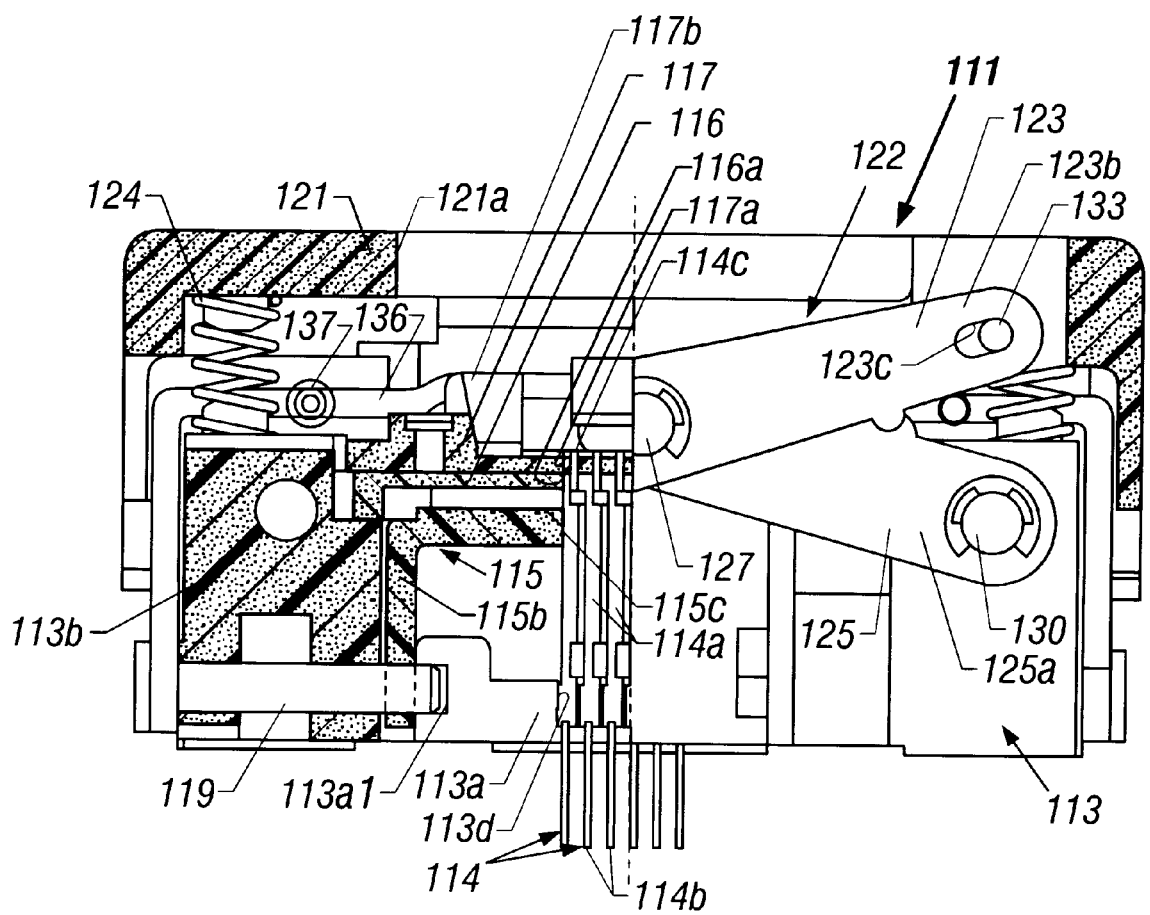
Figure 15:
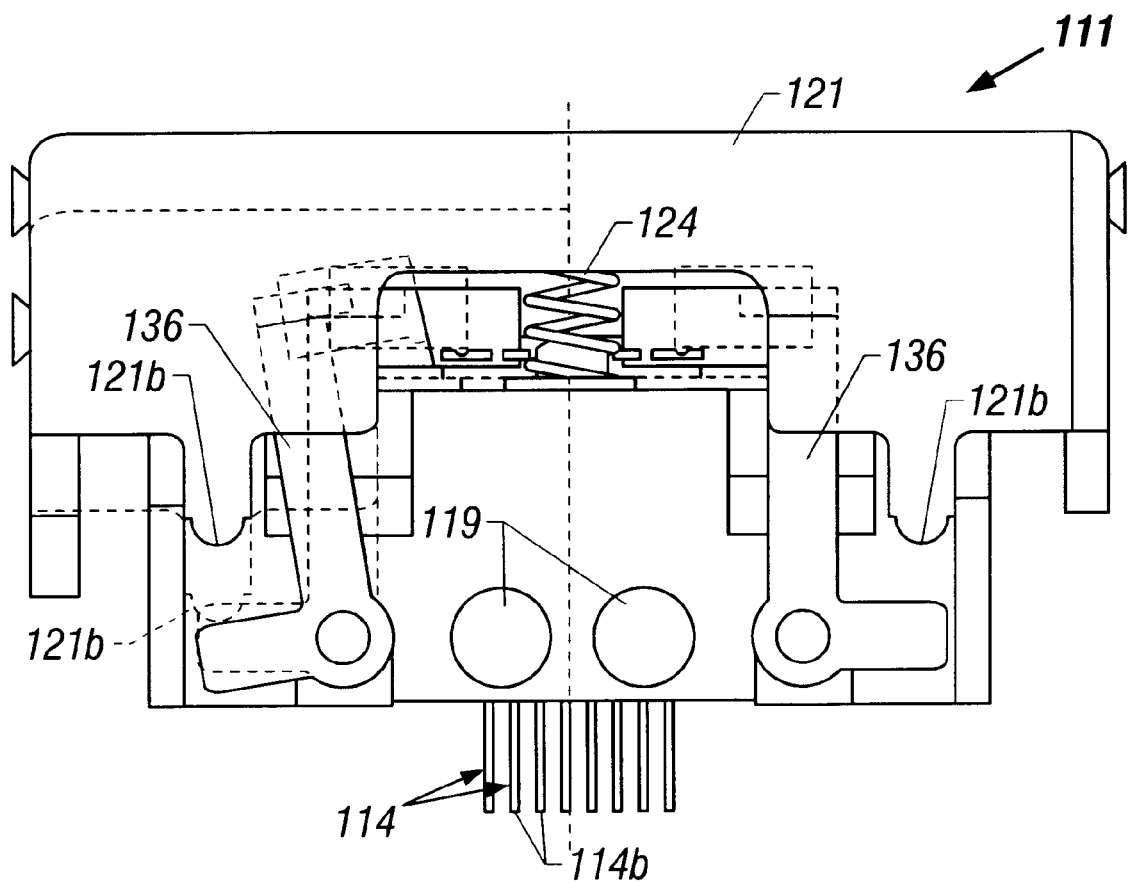
Figure 16:
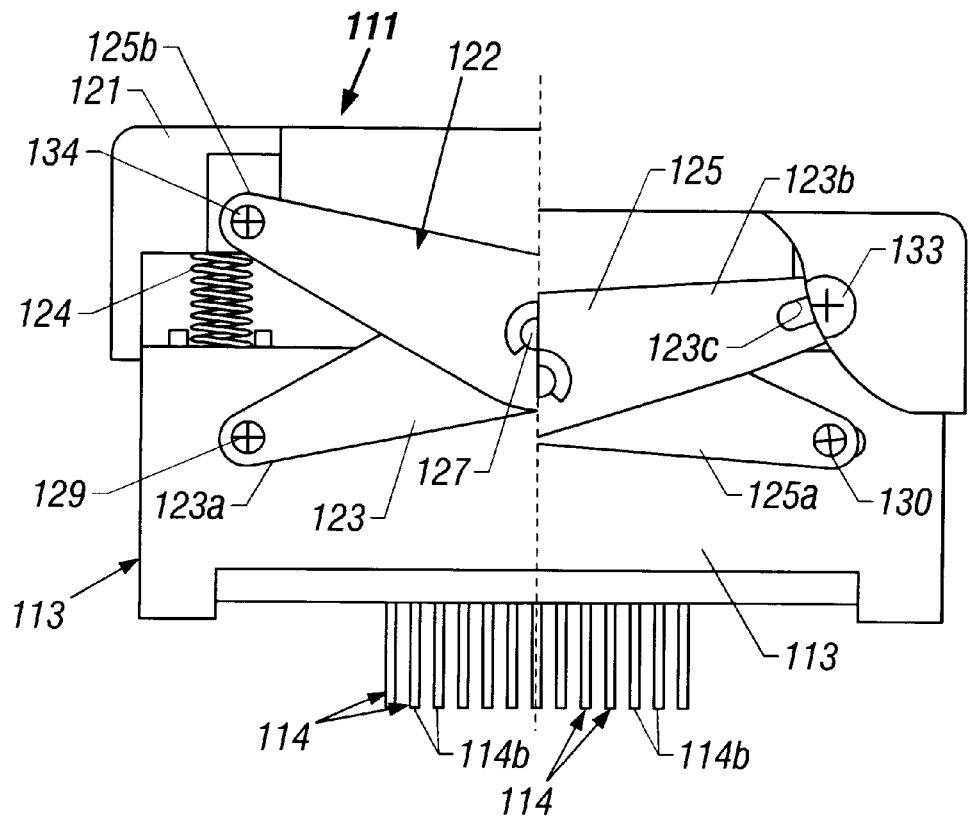
Figure 17:
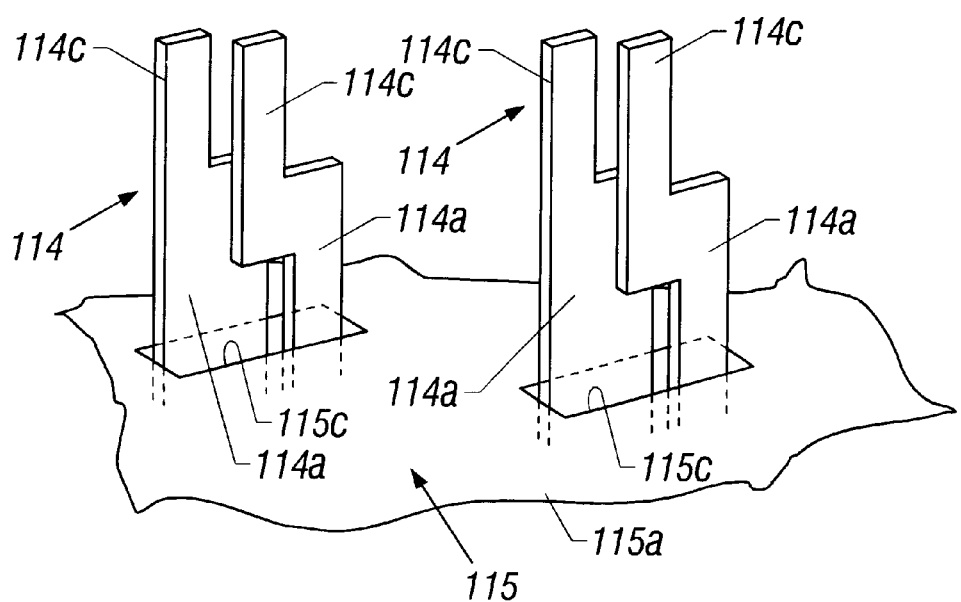
Figure 18:
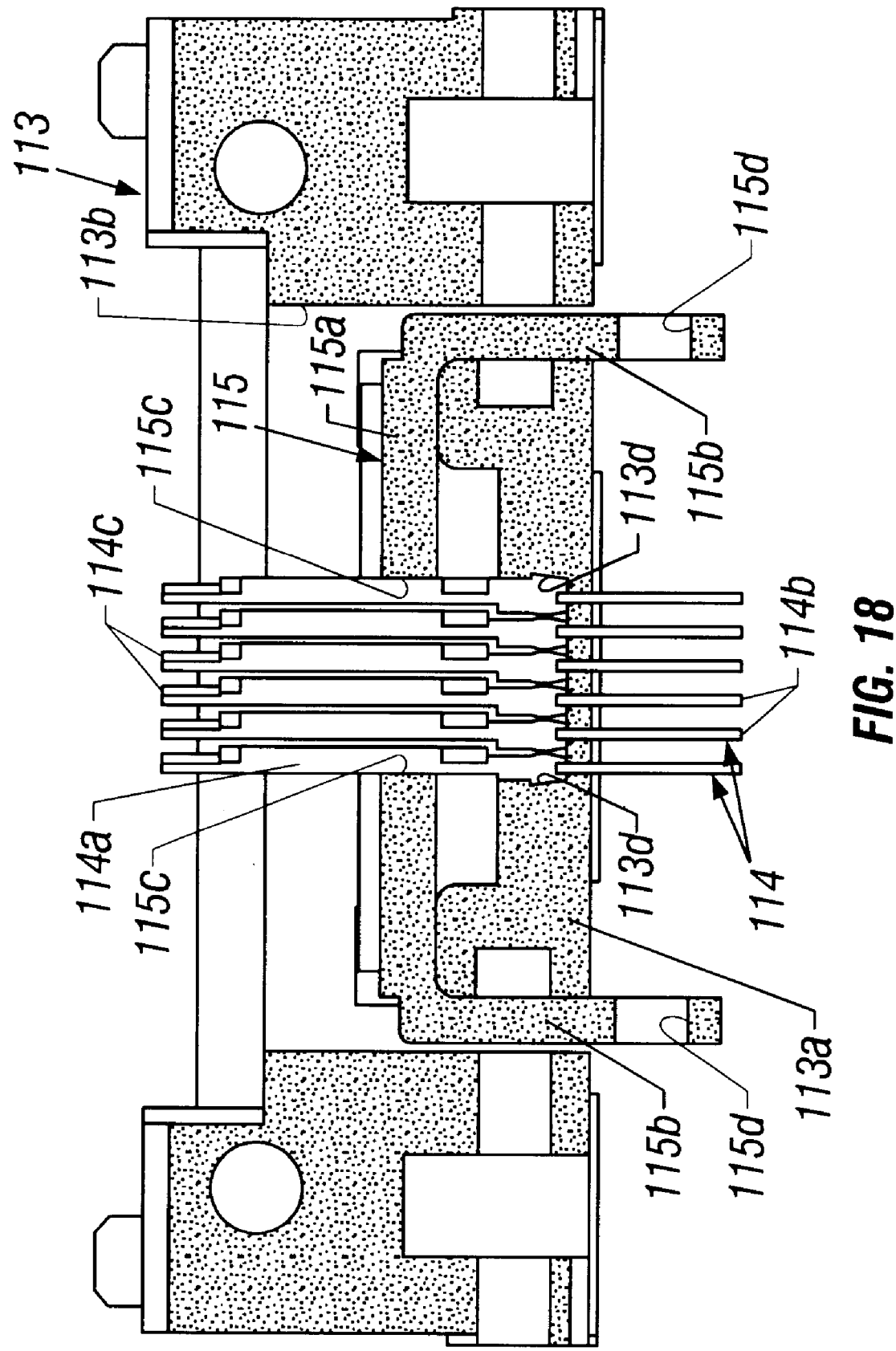
Figure 19:
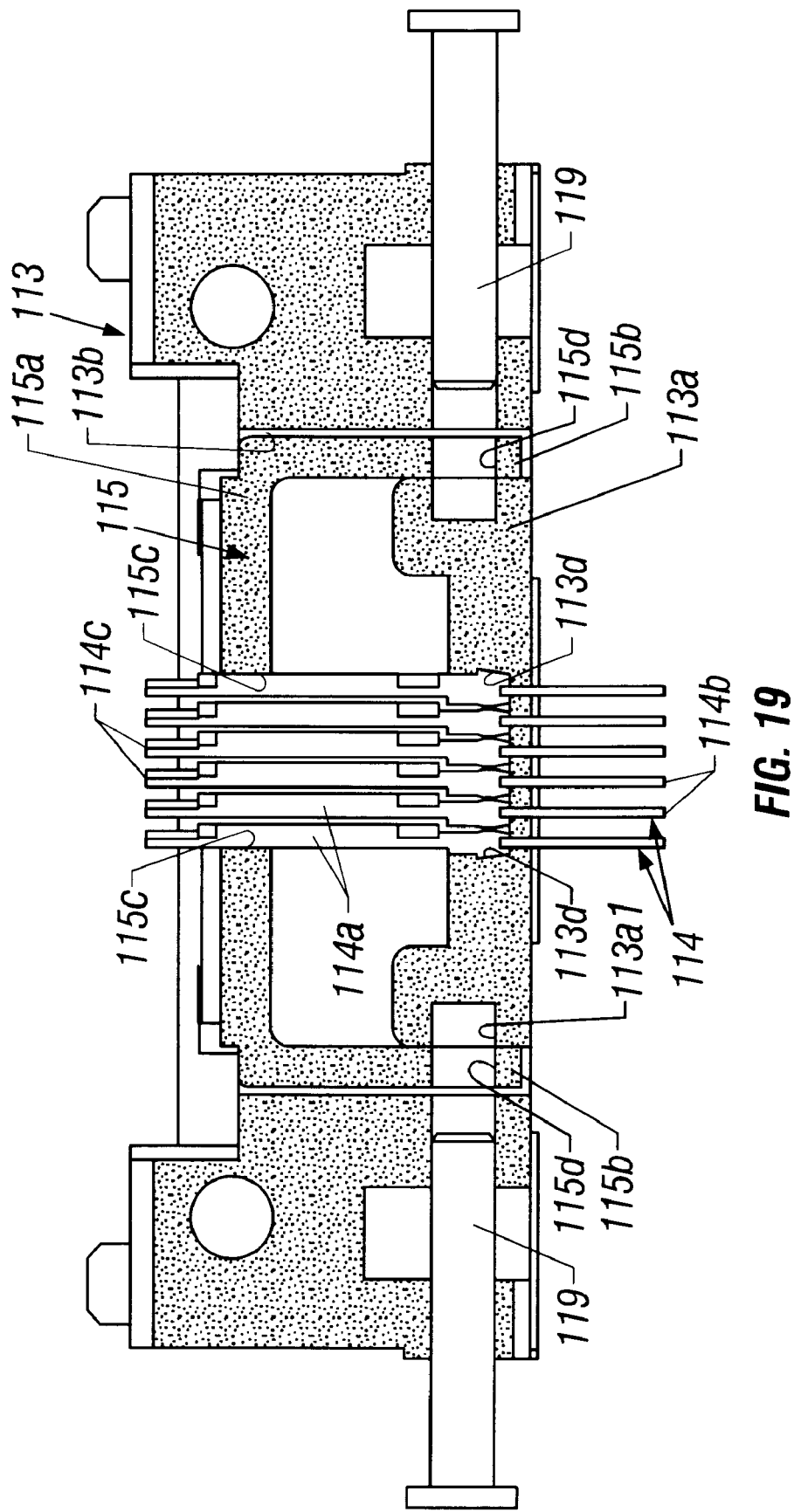
Figure 20:
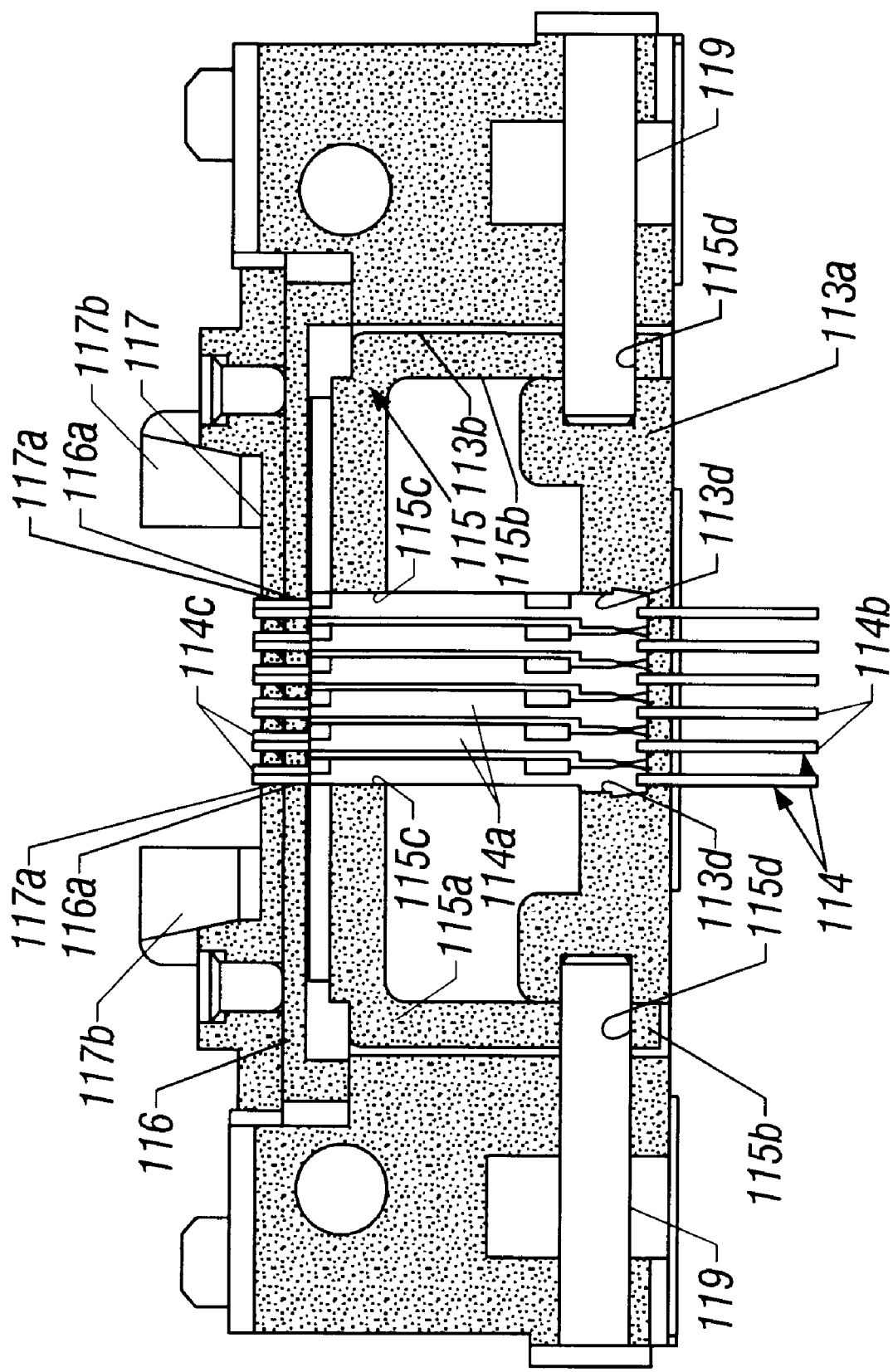
Figure 21:
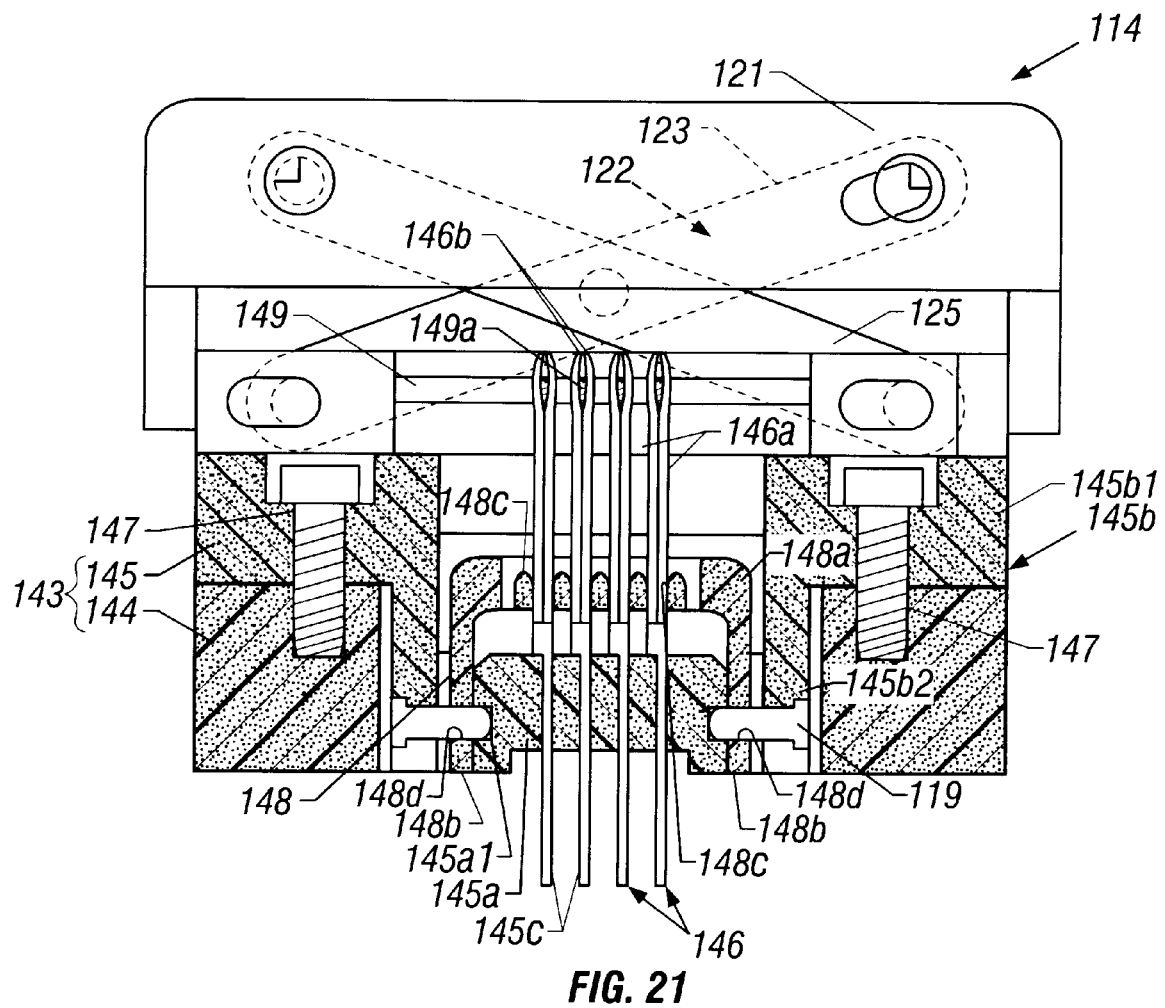
Figure 22:
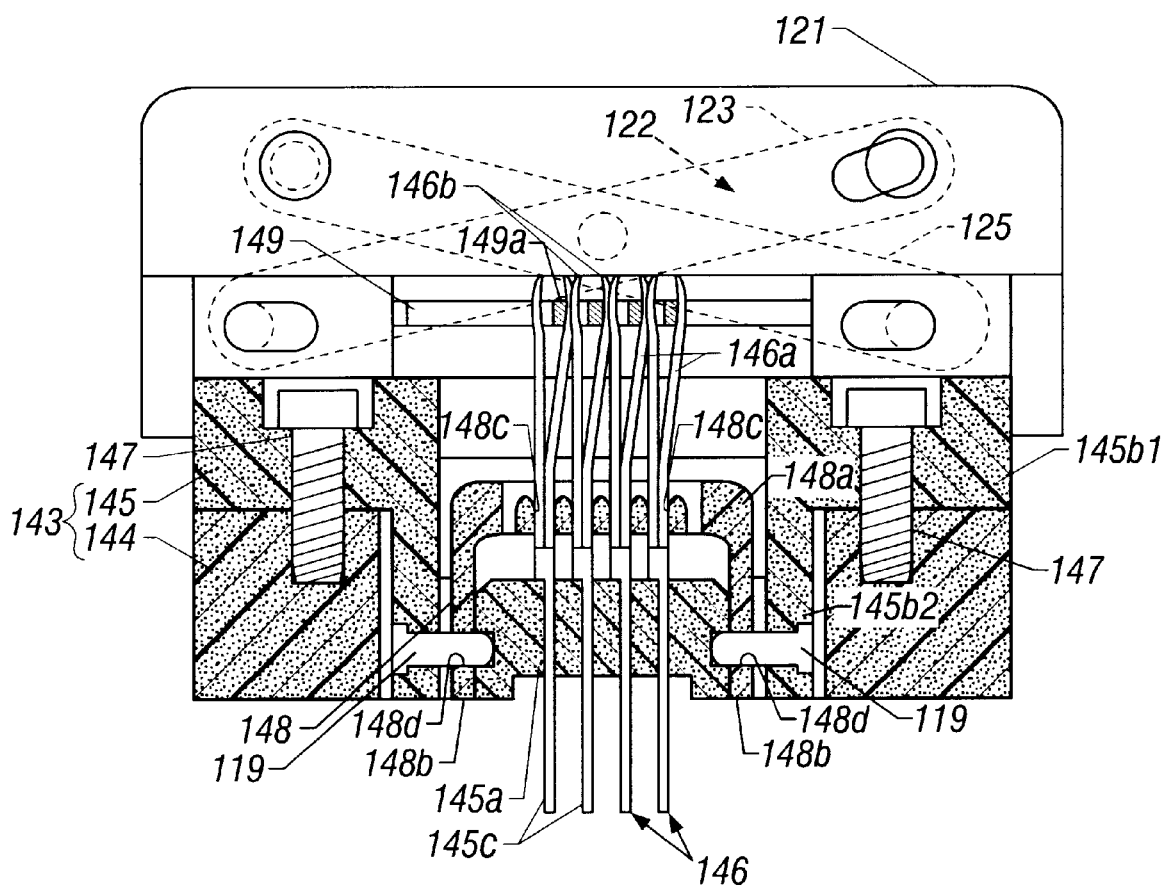
Figure 23:
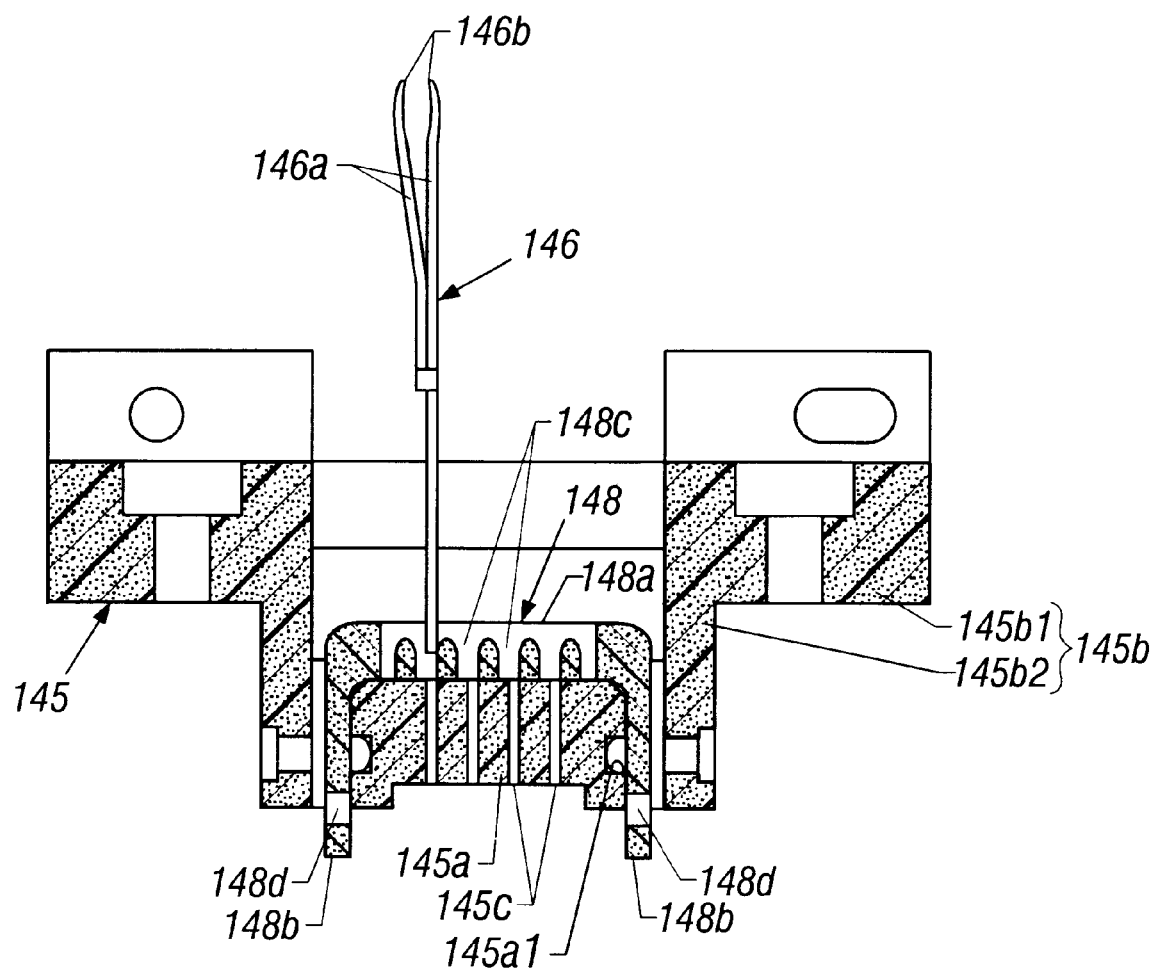
Figure 24:
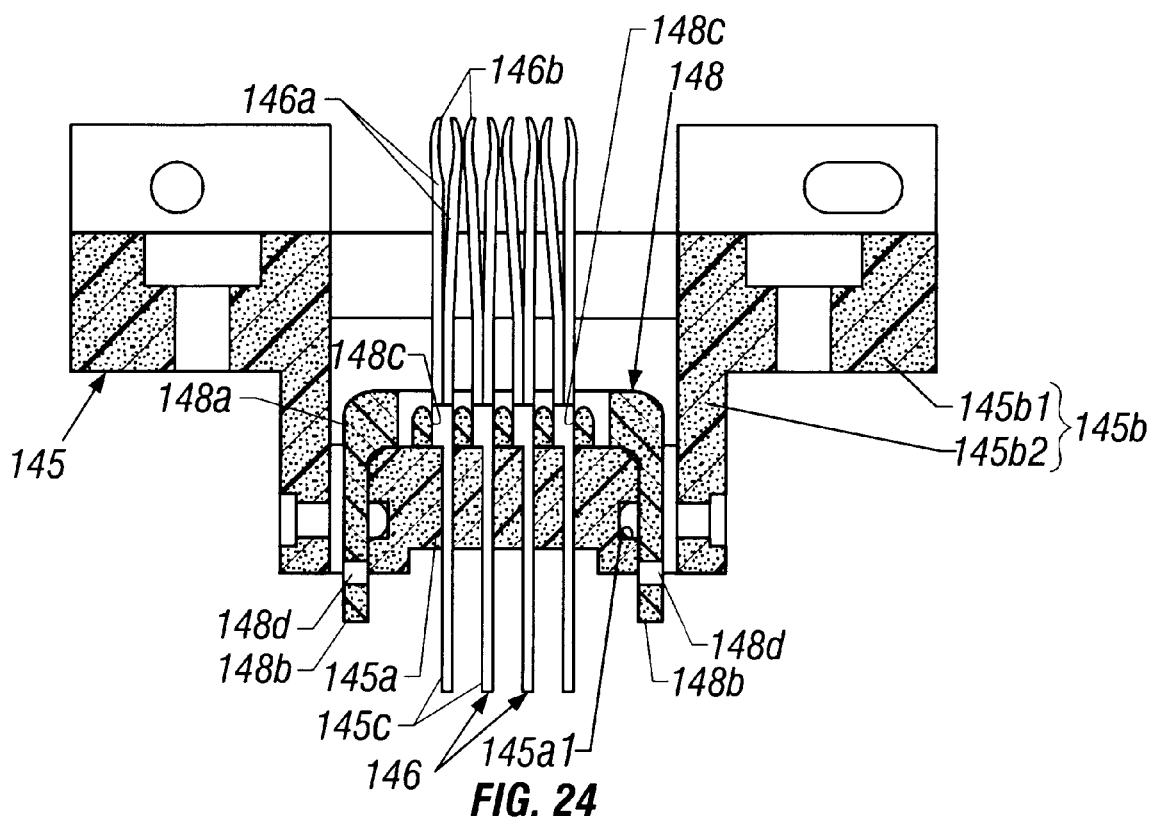
Figure 25:
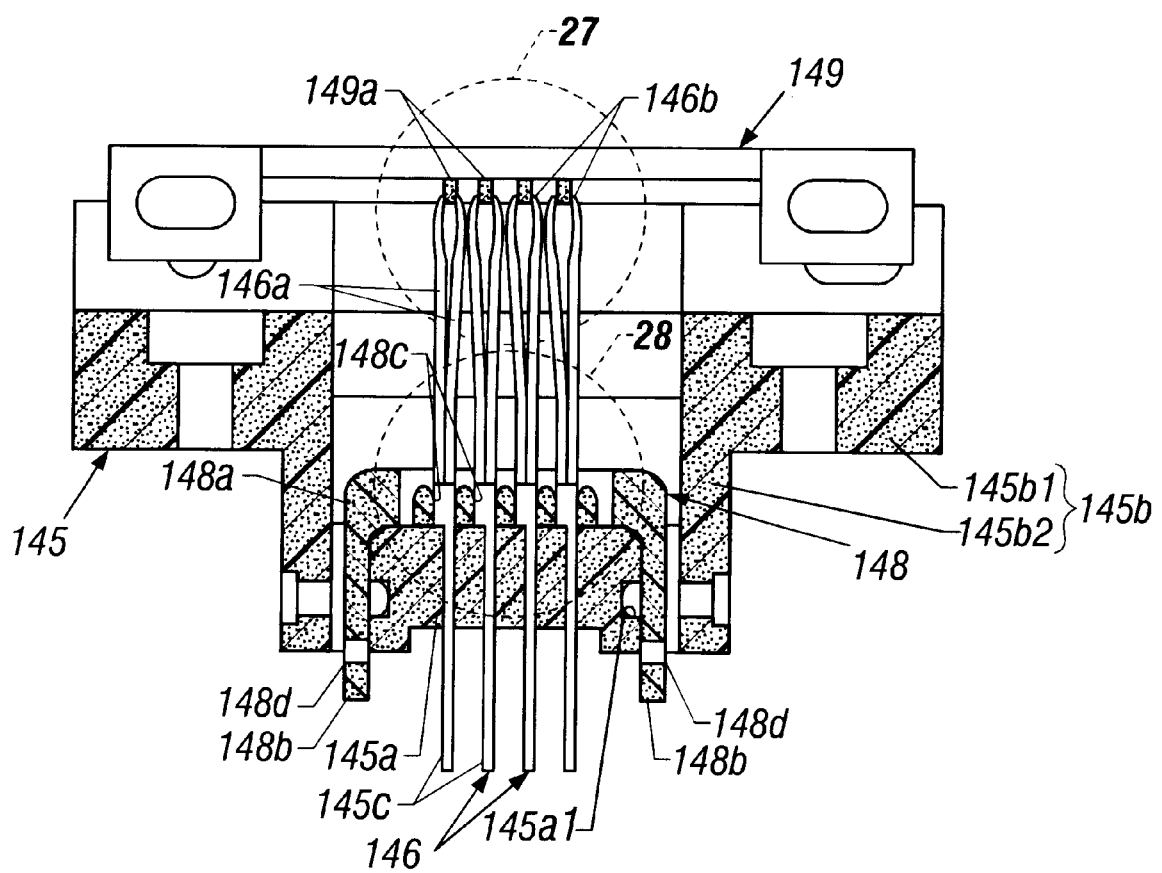
Figure 26:
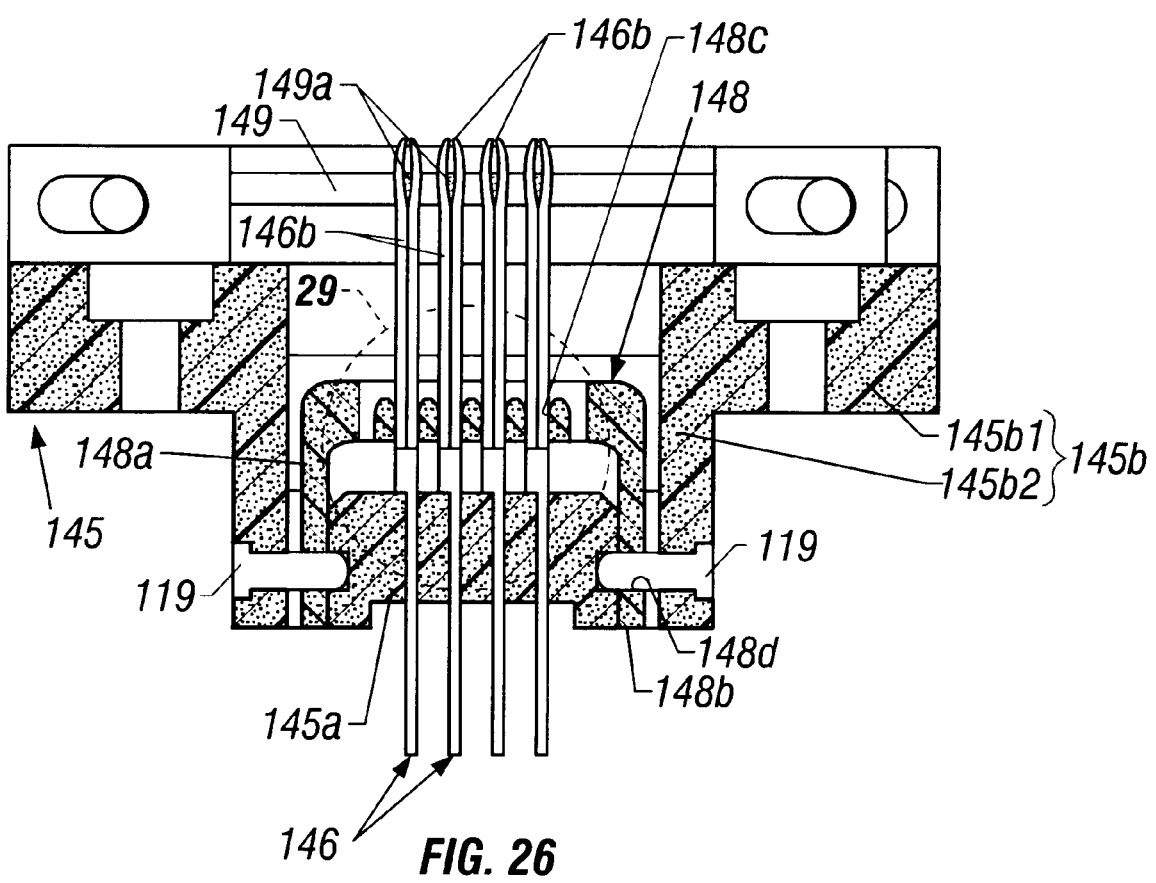
Figure 27:
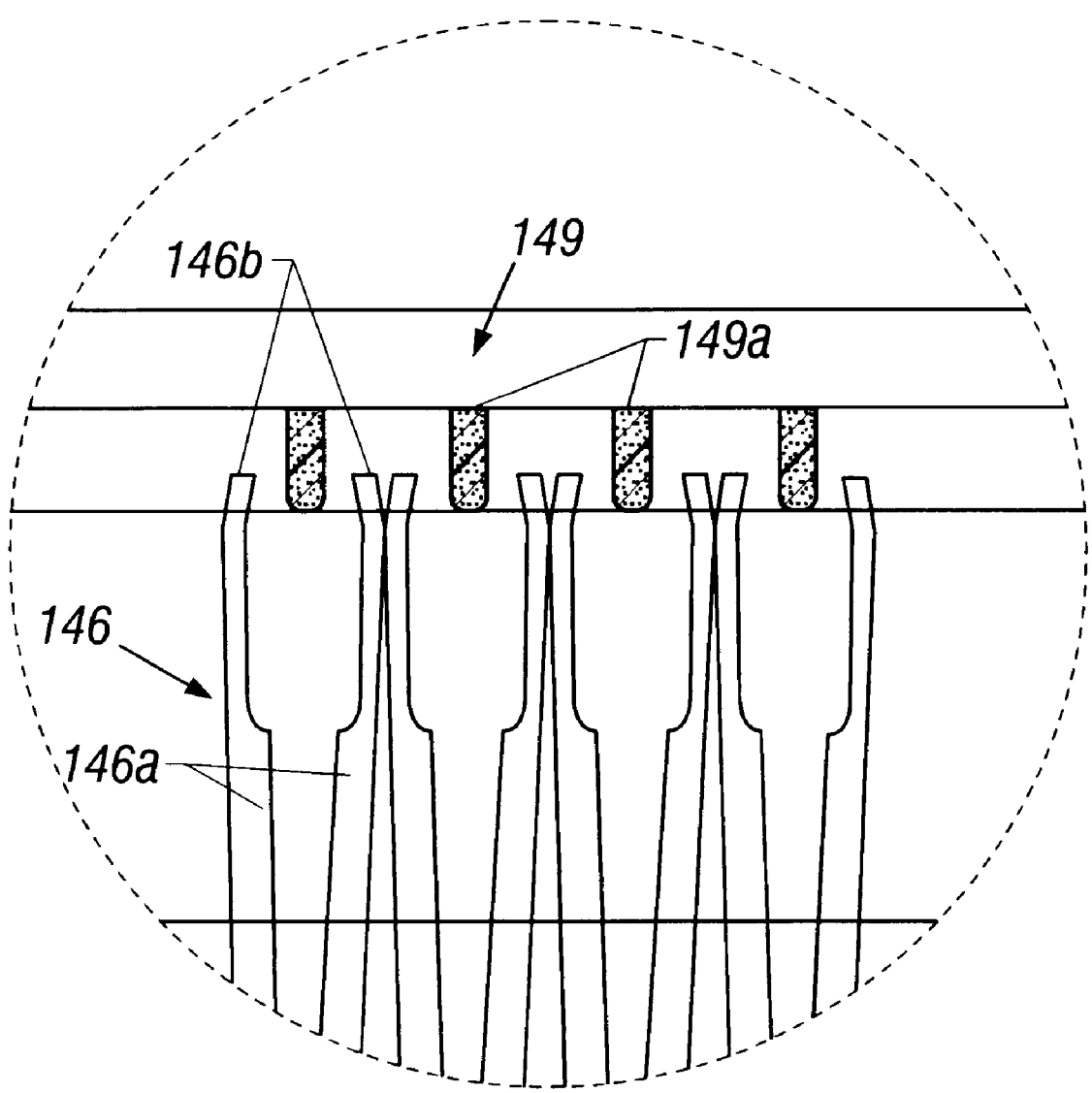
Figure 28:
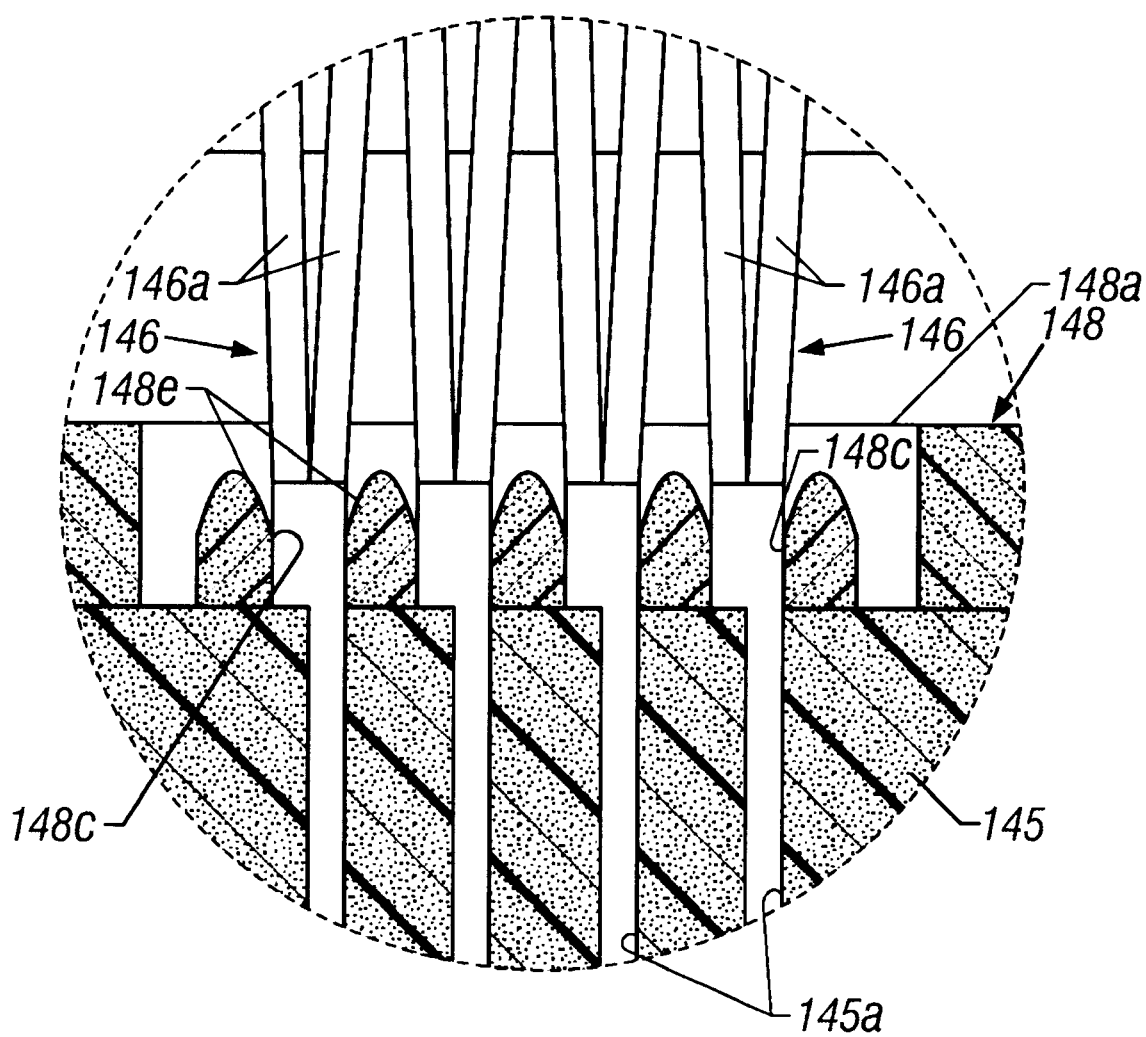
Figure 29:
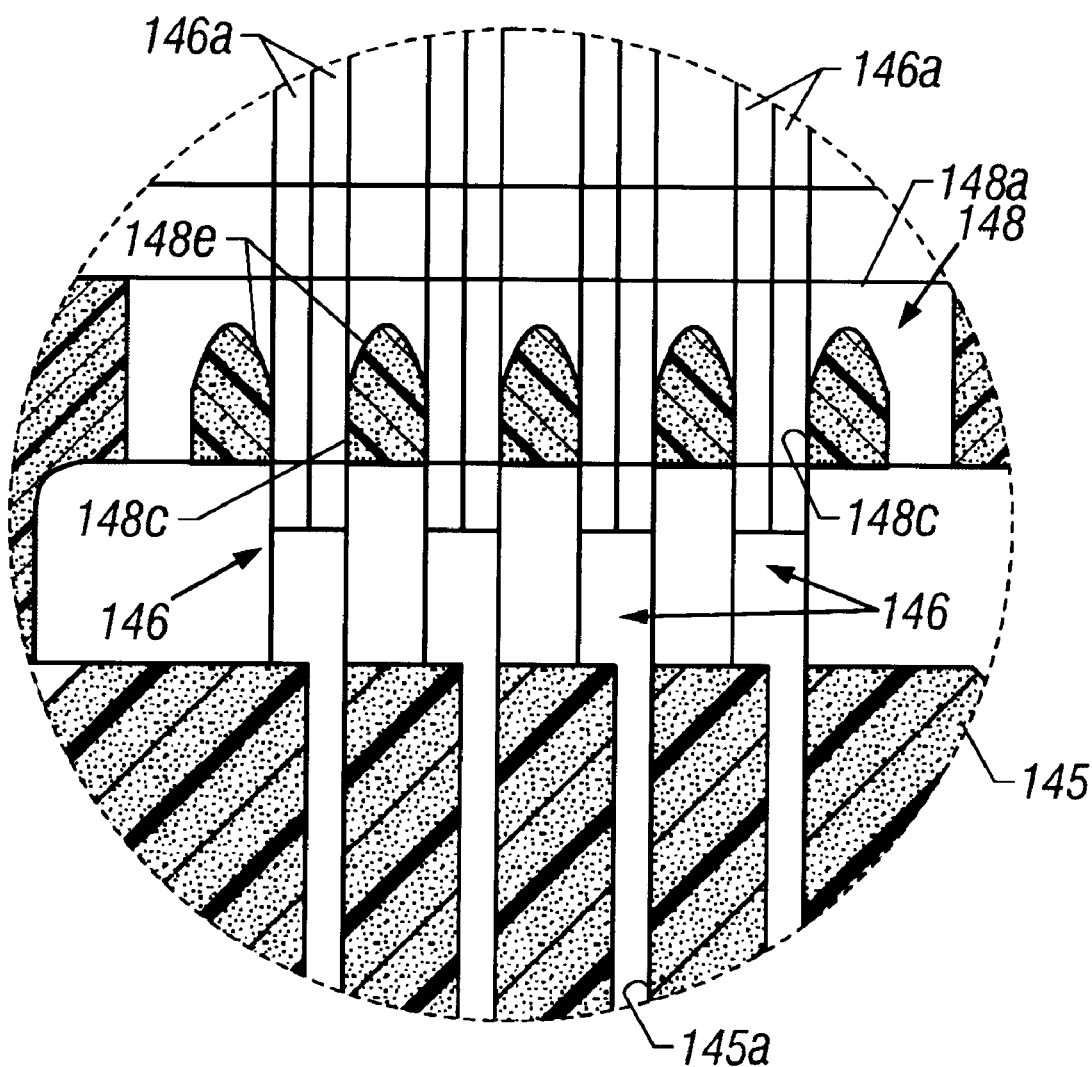

FIG. 11 is a cross sectional view along a vertical surface of an IC socket according to a third embodiment;

FIG. 12 is a plan view showing the IC socket according to the third embodiment;

FIG. 13 is a front view of the IC socket with parts partially broken away according to the third embodiment;

FIG. 14 is a view showing two different cross sections of the IC socket, in which the two different cross sections are bordered through a center line, according to the third embodiment;

FIG. 15 is a right side view of the IC socket according to the third embodiment;

FIG. 16 is a schematic view showing an X-shaped link of the IC socket and the like according to the third embodiment;

FIG. 17 is a perspective view showing a state that contact pins are inserted in positioning holes for a center plate according to the third embodiment;

FIG. 18 is a cross sectional view showing a state that contact pins are pressed to fit in a socket body according to the third embodiment;

FIG. 19 is a cross sectional view corresponding to FIG. 18 and showing a state that the contact pins are positioned by moving the center plate upward according to the third embodiment;

FIG. 20 is a cross sectional view showing a state that a top plate and so on are arranged according to the third embodiment;

FIG. 21 is a cross sectional view showing an IC socket according to a fourth embodiment;

FIG. 22 is a cross sectional view corresponding to FIG. 22 and showing a state that an upper operation member is moved downward according to the fourth embodiment;

FIG. 23 is a cross sectional view showing a state when a contact pin is pressed to fit in a center plate according to the fourth embodiment;

FIG. 24 is a cross sectional view showing a state that the contact pins have already fitted in the center plate and a press-fit plate according to the fourth embodiment;

FIG. 25 is a cross sectional view showing a state when a slide plate is arranged according to the fourth embodiment;

FIG. 26 is a cross sectional view showing a state that the contact pins are positioned by moving a center plate upward According to the fourth embodiment;

FIG. 27 is an enlarged view of A portion of FIG. 25 according to the fourth embodiment;

FIG. 28 is an enlarged view of B portion of FIG. 25 according to the fourth embodiment; and FIG. 29 is an enlarged view of C portion of FIG. 26 according to the fourth embodiment.

DESCRIPTION OF THE PREFERRED EMBODIMENTS

The preferred embodiments of the present invention will be described hereinafter with reference to the accompanying drawings.

[First Embodiment]

FIG. 1 to FIG. 9 show a first embodiment of the present invention.

Referring first to a structure of the first embodiment, reference numeral 11 in the drawings represents an IC socket as "socket for electrical parts" according to the present invention. For carrying out a performance test of an IC package as "the electrical part", the IC socket 11 electrically connects solder balls 12b as "terminals" of the IC package 12 to a printed circuit board (not shown) of a tester.

Figure 4A:
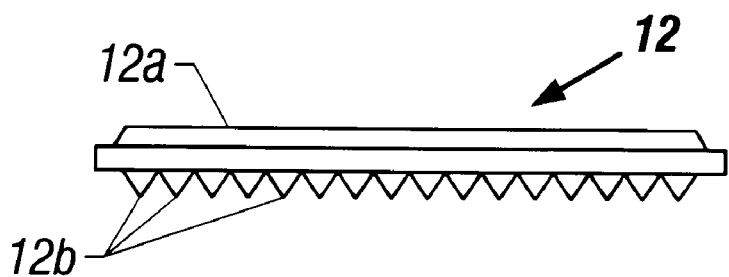
FIG. 4A is a front view showing an IC package according to the first embodiment.
Figure 4B:
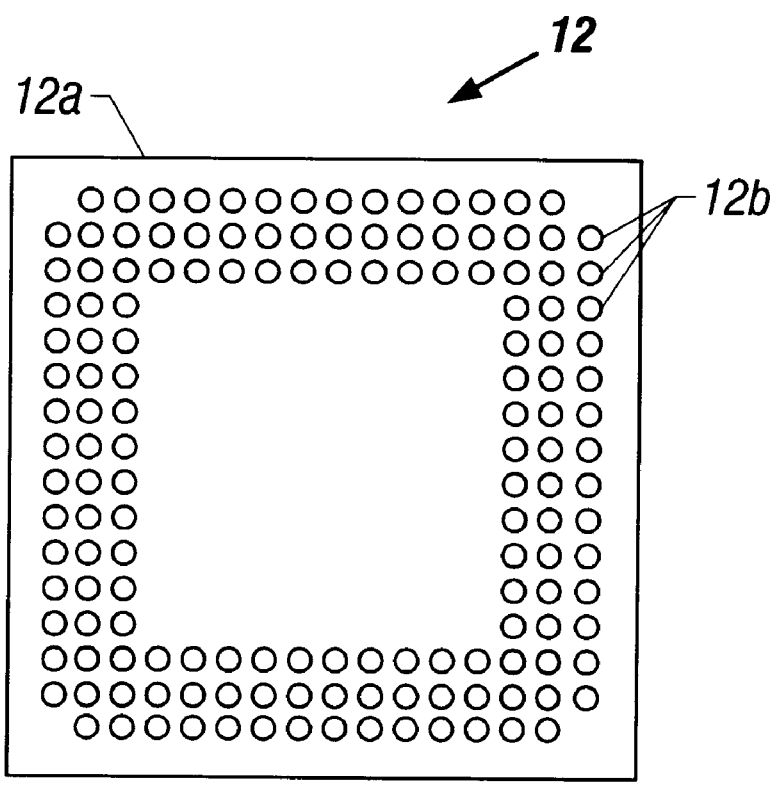
FIG. 4B is a bottom plan view showing the IC package according to the first embodiment.

This IC package 12, as shown in FIG. 4 for example, is called as Ball Grid Array (BGA) type. The BGA type IC package 12 is provided with a package body 12a having, for example, a substantially square shape and four corner portions. The IC package 12 is also provided with a plurality of solder balls 12b mounted on a bottom (lower) surface of the package body 12a so as to project downward therefrom. The solder balls 12b are arranged so as to be shaped in a matrix (grid array) arrangement, and each of the solder balls 12b has a substantially spherical shape.

Figure 1:
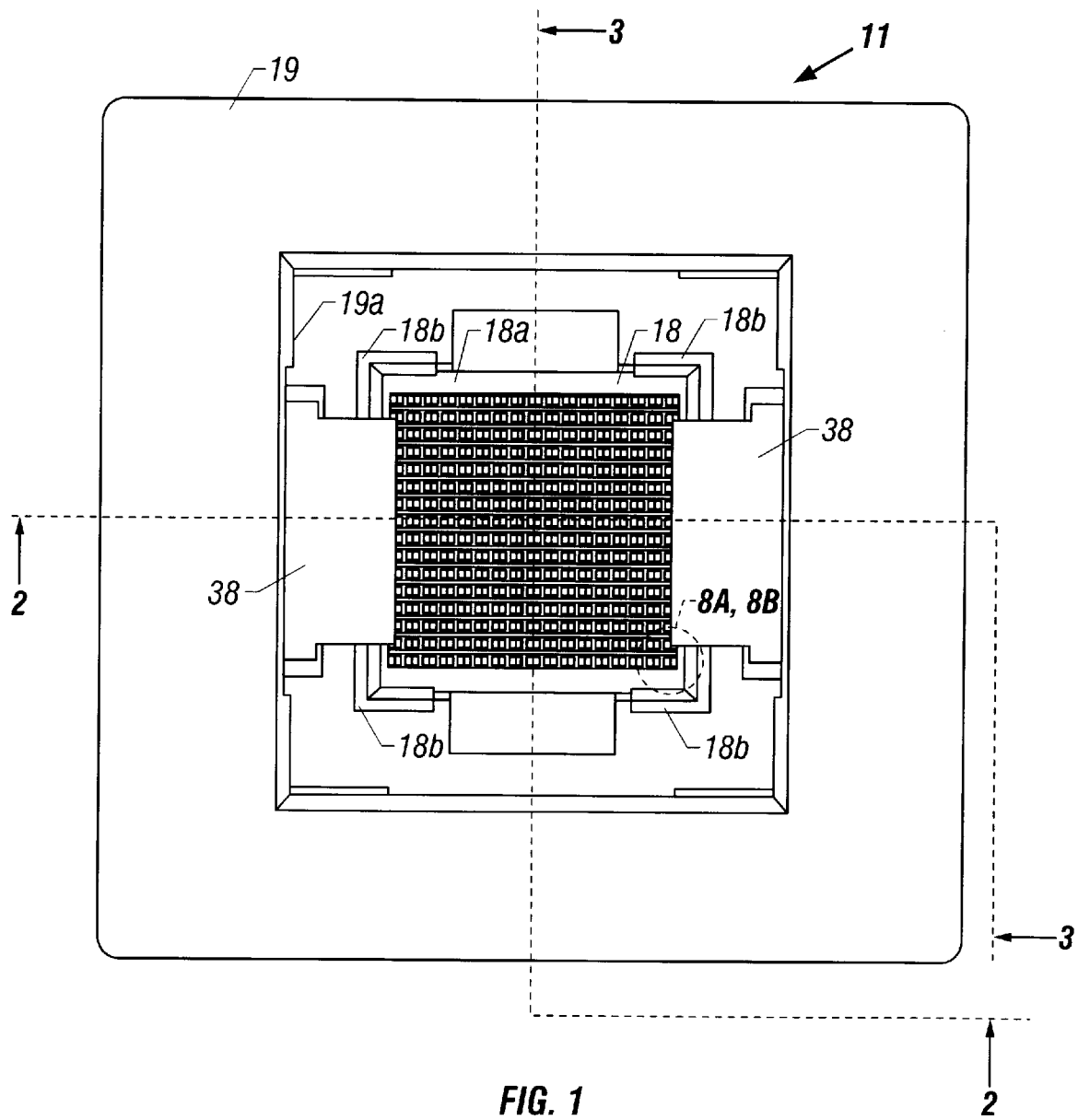
FIG. 1 is a plan view showing an IC socket according to a first embodiment of the present invention.
Figure 2:
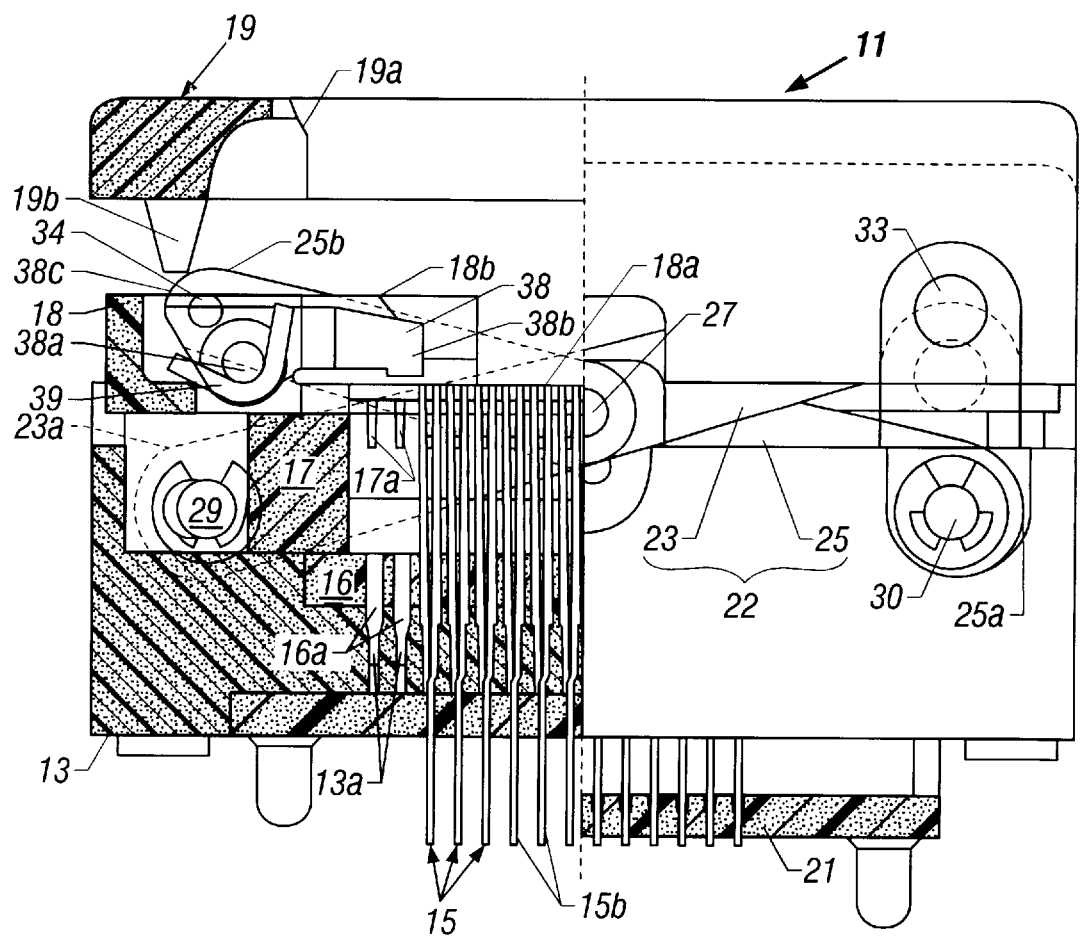
FIG. 2 is a cross sectional view taken along the line II—II of FIG. 1 according to the first embodiment.
Figure 3:
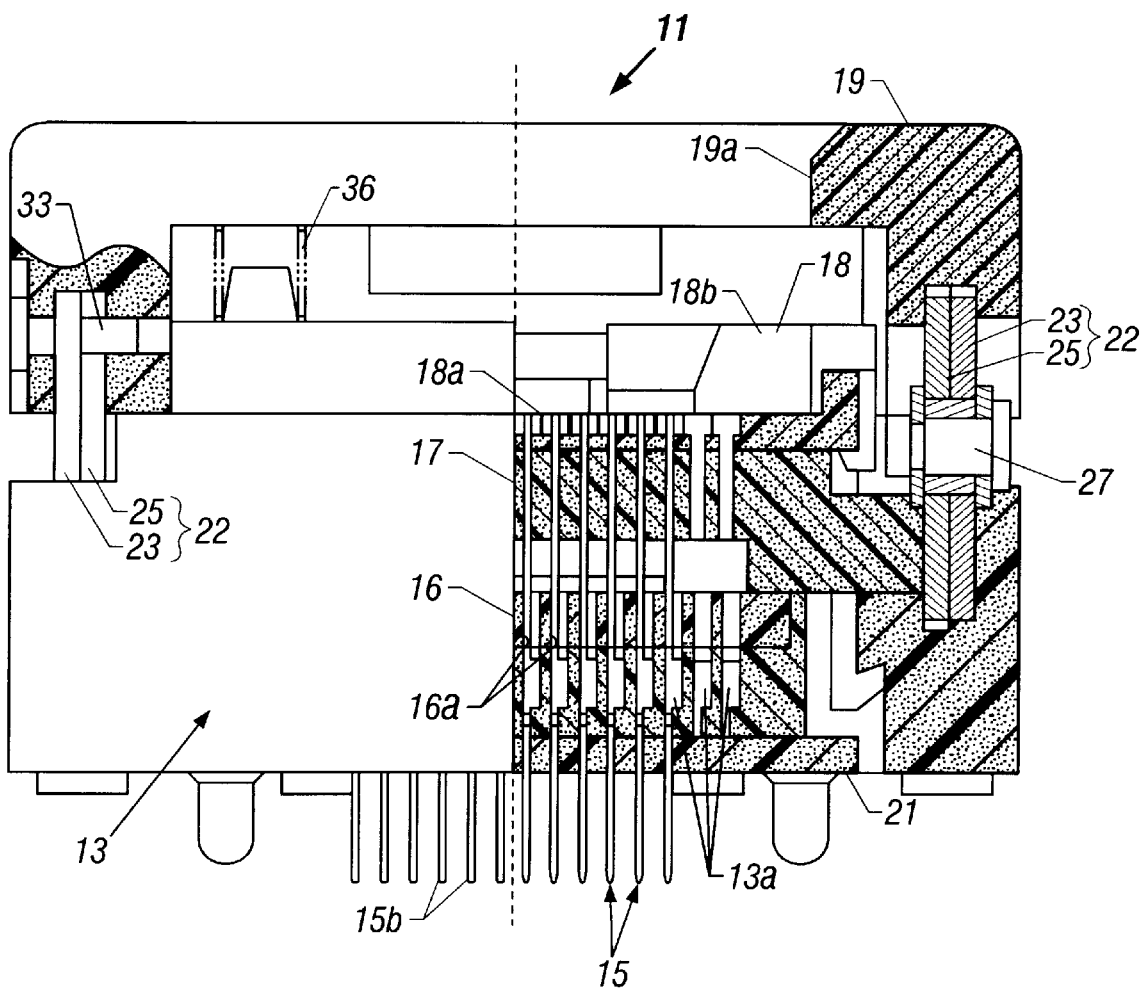
FIG. 3 is a cross sectional view taken along the line III—III of FIG. 1 according to the first embodiment.

On the other hand, the IC socket 11, as shown in FIGS. 1 to 3, is provided with a socket body 13 mounted on the printed circuit board, and a plurality of contact pins 15. The contact pins 15 are arranged so as to be shaped in a matrix (grid array) arrangement similar to the solder balls and permitted to be contacted to or separated from the solder balls 12b, respectively.

The IC socket 11 is also provided with a pre-load (preloading) plate 16 as "pre-load means" through which the contact pins 15 are inserted, a square shaped slide plate 17 as "movable plate" and a top plate 18. The pre-load plate 16, the slide plate 17 and the top plate 18 are mounted on an upper side of the socket body 13 so as to be successively laminated towards an upward direction of the socket body 13. Furthermore, on the upper side of the top plate 18, an upper operation member 19 is arranged for sliding the slide plate 17 in a horizontal direction.

Figure 5:
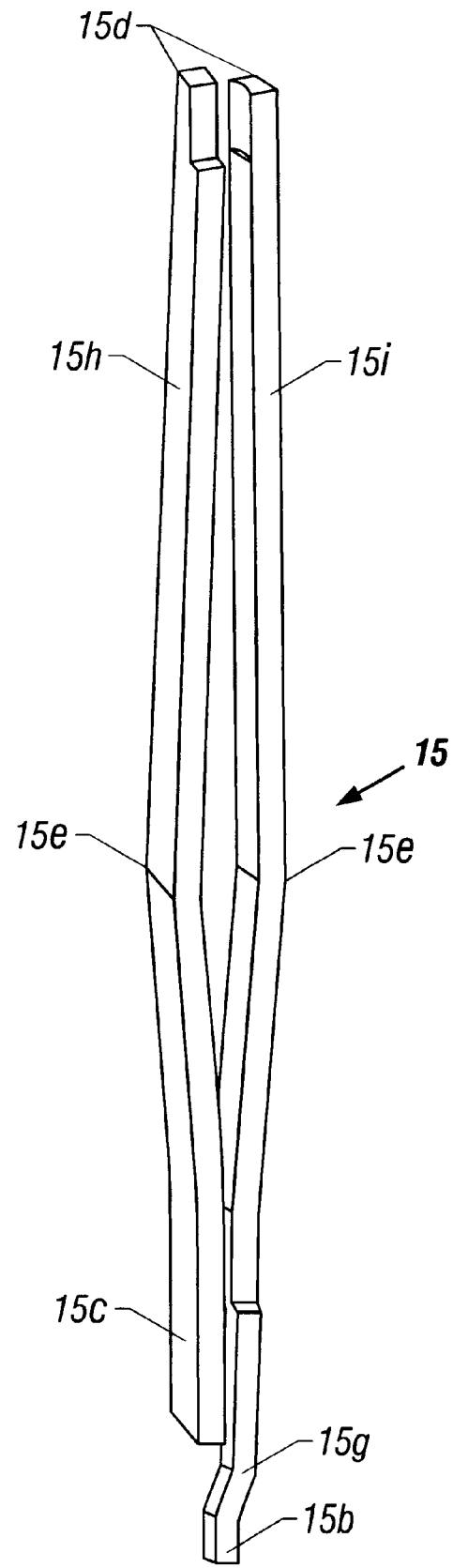
FIG. 5 is a perspective view showing a contact pin according the first embodiment.

The contact pin 15 has an elasticity and is formed in such a manner that a plate member having a superior conductivity is pressed by a press working so as to have a shape shown in FIGS. 5, 6 and so on. To explain it in detail, the contact pin 15 is formed at its upper end side with a stationary side elastic piece 15h and a movable side elastic piece 15i (a pair of elastic pieces), and at its lower end side with one integrated solder tail portion 15b. Incidentally, the stationary side elastic piece is referred simply to the stationary elastic piece and the movable side elastic piece is referred simply to the movable elastic piece.

The contact pin 15 is also provide, at its lower side of the elastic pieces 15h and 15i, with a base portion 15c so that the elastic pieces 15h and 15i are commonly integrated thereby. The elastic pieces 15h and 15i extend upward from the base portion 15c and the solder tail portion 15b extends downward therefrom. The base portion 15c is bent so as to have a substantially U-shape in its lateral cross section so that the elastic pieces 15h and 15i branching from the base portion 15c are opposite to each other. Each of the elastic pieces 15h and 15i is formed, at its uppermost end (front end), with a contact portion 15d so as to be contacted to or separated from a side surface portion of the solder ball 12b.

The solder ball 12b is adapted to be clamped in the paired contact portions 15d of the paired elastic pieces 15h and 15i.

Each of the elastic pieces 15h and 15i of the contact pin 15 is provided with a bent portion 15e. The bent portions 15e of the respective elastic pieces 15h and 15i are formed at respective middle portions thereof so that the respective middle portions of the elastic pieces 15h and 15i are bent far from each other. A vertex portion of each of the bent portions 15e is pressed by the pre-load plate 16. While the bent portions 15e are not subjected to any external force, as shown in FIG. 6A, a width (interval) H1 formed between the respective vertex portions of the bent portions 15e of the paired elastic pieces 15h and 15i is wider than a width (interval) H2 formed between respective top ends of the paired contact portions 15d thereof.

The solder tail portion 15b extends downward from the base portion 15c. The solder tail portion 15b is provided with a portion 15g formed near the base portion 15c of the pair of elastic pieces 15h and 15i. The contact pin 15 is formed in that the solder tail portion 15b, as shown in FIG. 6, is bent at the close portion 15g so that a center line O1 between the paired elastic pieces 15h and 15i coincides with a center line O2 of the solder tail portion 15b.

On the other hand, press-fit holes 13a are formed through the socket body 13a and through holes are formed through the printed circuit board (not shown).

The solder tail portion 15b and the base portion 15c of the contact pin 15 are integrally pressed to fit in the press-fit hole 13a so that the solder tail portion 15b projects downward therefrom, as shown in FIGS. 2 and 3. The projecting solder tail portion 15b furthermore projects downward through a locate board 21 so as to be inserted into the through hole. While each of the solder tail portions 15b of each of the contact pins 15 is inserted in each of the through holes, each of the solder tail portions 15b is soldered so as to be electrically connected to the printed circuit board. Furthermore, the pre-load plate 16 is detachably and separately mounted on the socket body 13, and, through the pre-load plate 16, pre-load holes 16a are formed so that each of the paired elastic pieces 15h and 15i is inserted in each of the pre-load holes 16a. A width of the pre-load hole 16a is set so that, in a state that each of the paired elastic pieces 15h and 15i is inserted in each of the pre-load hole 16a, the pre-load hole 16a is adapted to previously press the paired elastic pieces 15h and 15i along a direction in that the contact portions 15d of the elastic pieces 15h and 15i are close to each other. That is, before the slide plate 17 is slid, the elastic pieces 15h and 15i are previously pressed by the pre-load plate 16 along the direction in that a space between the paired elastic pieces 15h and 15i is narrow.

Because the bent portion 15e is formed on each of the paired elastic pieces 15h and 15i, while each of the paired elastic pieces 15h and 15i is inserted in each of the pre-load holes 16a, the vertex portions of the bent portions 15e are pressed by an inner wall of the pre-load hole 16a (as referred to FIG. 6B).

On the other hand, the slide plate 17 is arranged to be slidable in a right and left direction (horizontal direction) in FIG. 2. When the slide plate 17 is slid, the movable elastic piece 15i of the contact pin 15 is elastically deformed so as to be displaced.

Figure 9:
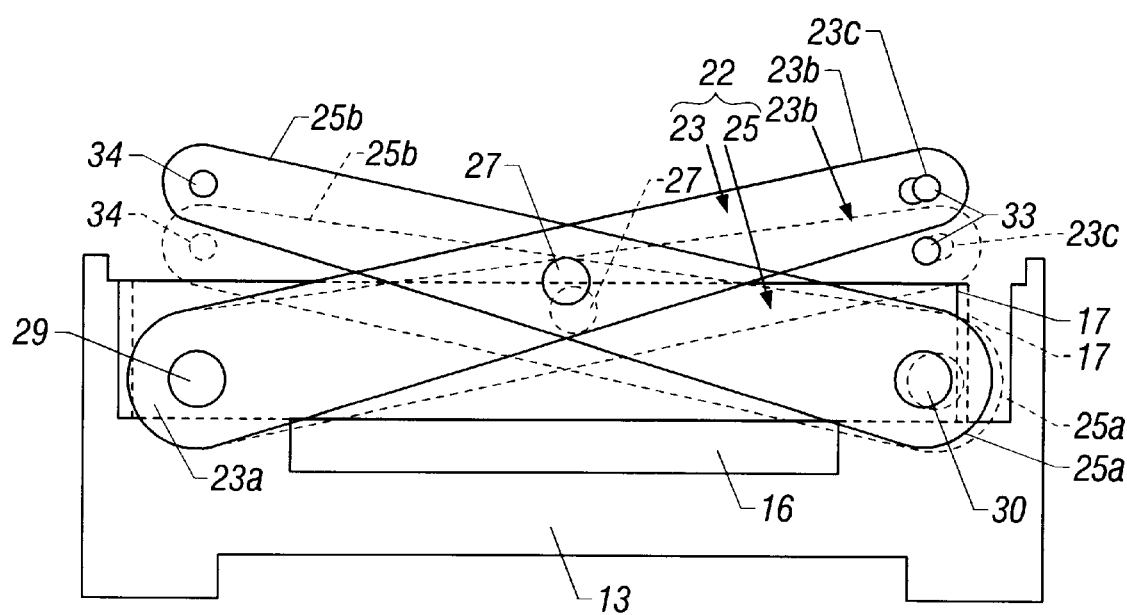
FIG. 9 is a view for explaining a movement of an X-shaped link according to the first embodiment.

The upper operation member 19 and the slide plate 17 are mechanically connected through X-shaped links 22 shown in FIGS. 2 and 9, and the slide plate 17 is provided with a press portion 17a arranged to be inserted between the stationary elastic piece 15h and the movable elastic piece 15i. The press portion 17a of the slide plate 17 is also arranged in contact to the movable elastic piece 15i and adapted to press the movable elastic piece 15i.

That is, when the upper operation member 19 is moved vertically, the slide plate 17 is slid in the horizontal direction by operations of the X-shaped links 22 so that the movable elastic piece 15i is pressed by the press portion 17a of the slide plate 17 so as to be elastically deformed thereby.

The X-shaped links 22 are disposed at positions corresponding to both side surface portions of the square shaped slide plate 17, which are arranged along the slide direction of the slide plate 17, so as to constitute a toggle joint mechanism.

To explain it concretely, the X-shaped link 22, as shown in FIGS. 2 and 9, is provided with a first link member 23 and a second link member 25 each having the same length. The first link member 23 and the second link member 25 are rotatably joined by a center joint pin 27.

The first link member 23 has a lower end portion 23A in FIG. 9, that is, one end portion 23a of the socket body side, and the lower end portion 23a is pivotally joined to the socket body 13 by a lower end joint pin 29. The second link member 25 has a lower end portion 25a of the socket body side, and the slide plate 17 has one end portion along the slide direction thereof. The lower end portion 25a of the second link member 25 is rotatably joined to the one end portion of the slide plate 17 by a lower end joint pin 30. Upper end portions 23b and 25b, that is, other end portions opposite to the one end portions 23a and 25a of the first and second link members 23 and 25 are joined to the upper operation member 19 by upper joint pins 33 and 34, respectively. The first link member 23 is formed at its upper end portion 23b with a slot 23c so that the first link member 23 is joined through the slot 23c to the upper operation member 19 by the upper joint pin 22.

The top plate 18 is provided with a mount surface portion 18a, referred simply to as a mount surface, on which the IC package 12 is mounted, and guide portions 18b for arranging the IC package 12 to a predetermined position. As shown in FIG. 1, the guide portions 18b are formed on the mount surface 18a at portions corresponding to the corner portions of the IC package 12, respectively.

Furthermore, the top plate 18 is formed with positioning portions 18c. Each of the positioning portions 18c is arranged to be inserted between each of the paired contact portions 15d of each of the contact pins 15. The positioning portion 18c has a function for positioning the paired contact portions 15d of each of the contact pins 15.

While the solder ball 12b of the IC package 12 is not inserted between the contact portions 15d of the contact pin 15 (the contact portions 15d are closed), the positioning portion 18c, is clamped with the elastic pieces 15h and 15i so as to be held thereby (as referred to FIGS. 7 and 8).

The upper operation member 19, as shown in FIGS. 1, 2 and so on, is provided with an opening 19a having a predetermined area which allows the IC package 12 to be inserted therein. The IC package 12 is inserted through the opening 19a so as to be mounted on the mount surface 18a, wherein the IC package 12 is located at the predetermined position defined by the guide portions 18b.

The upper operation member 19, as shown in FIG. 3, is arranged to be movable vertically with respect to the socket body 13, and is urged upward by springs 36. The upper operation member 19 is also formed with a pair of convex (protruded) portions 19b for rotating a pair of latch members 38 (as referred to FIG. 2).

The paired latch members 38, as shown in FIGS. 1 and 2, are arranged opposite to each other through the mount surface 18a of the top plate 18. The paired convex portions 19b of the upper operation member 19 are opposite to the paired latch members 38.

Each of the paired latch members 38 is disposed through a shaft (or shaft pin) 38a to the socket body 13 so as to rotate about the shaft 38a. Each of the latch members 38 is provided with a hold portion 38b for holding a peripheral portion of the IC package 12 mounted at the predetermined position on the mount surface 18a. Each of the latch members 38 is also formed with a press portion 38c adapted to be pressed by the convex portion 19b of the upper operation member 19.

One of the latch members 38 shown in FIG. 2 (referred to first latch member) is urged by a spring 39 toward a clockwise direction in FIG. 2, and other thereof which is not shown in FIG. 2(referred to second latch member) is urged by the spring 39 towards a counter clockwise direction in FIG. 2.

When the upper operation member 19 is moved downward against the urging force of the springs 36, the press portion 38c of each of the first and second latch members 38 is pressed by the convex portion 19b so that the first latch member 38 is rotated against the urging force of the spring 39 towards a counterclockwise direction in FIG. 2 and the second latch member 38 is rotated against the urging force of the spring 39 toward a clockwise direction in FIG. 2, whereby the hold portion 38b of each of the first and second latch members 38 is withdrawn from a mount position of the IC package 12 on the mount surface 18a to a predetermined withdrawal position at which the mount of the IC package to the top plate 18 is not interfered.

Incidentally, in this specification, "vertical direction" is employed to mean "a direction orthogonal to the mount surface 18a of the top plate 18" and, "an upper direction, an upward direction and other similar descriptions are employed to mean "a direction away from a connection side surface (bottom surface) of the socket body 13 connected to the printed circuit board, as shown in FIG. 2. Similarly, "a lower direction, a downward direction and other similar descriptions" are employed to mean "a direction close to the connection side surface of the socket body 13 connected to the printed circuit board.

Next, an operation of the IC socket 11 of the first embodiment will be explained hereunder.

Incidentally, each of the X-shaped links 22 performs substantially the same operation, and therefore, the operation of one of the X-shaped links 22 will be explained. Similarly, each of the contact pins 15 performs substantially the same movement, so that the movement one of the contact pins 15 will be explained.

When the IC package 12 is set to the IC socket 11, the upper operation member 19 is pressed downward. The downward movement of the upper operation member 19 makes the slide plate 17 slide in a right direction, which is shown with two-dots and chain line in FIG. 9. By the press portion 17a of the slide plate 17 sliding in the right direction, the movable elastic piece 15i is pressed to be elastically deformed so that the elastic piece (movable elastic piece 15i) displaces from an original position. The other elastic piece 15h is kept at a predetermined position by the positioning portion 18c of the top plate 18.

Figure 7A:
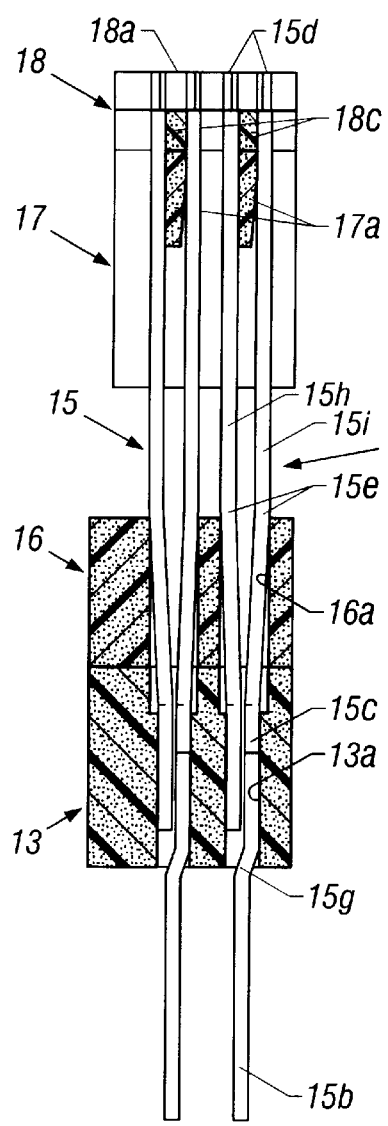
FIG. 7A is a cross sectional view showing a state that a pair of contact portions of each of the contact pins is closed for explaining an operation according to the first embodiment.
Figure 7B:
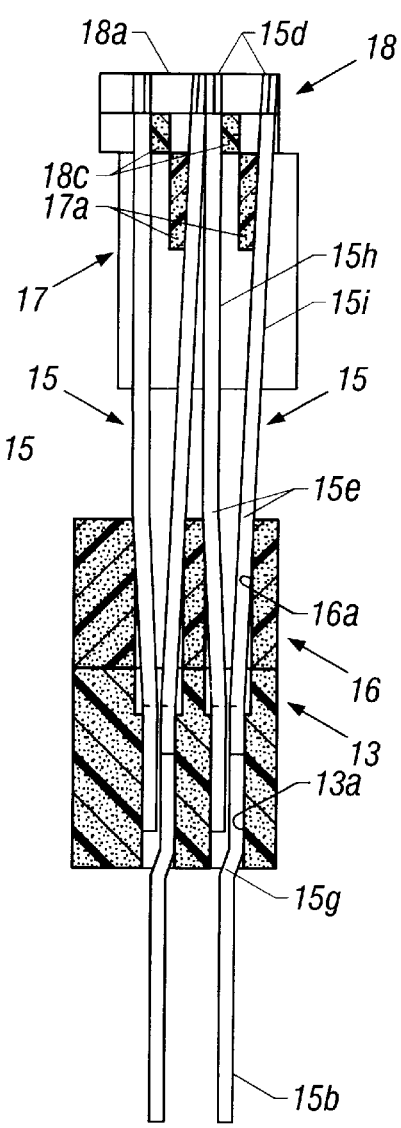
FIG. 7B is a cross sectional view showing a state that the pair of contact portions of each of the contact pins is opened for explaining the operation according to the first embodiment.
Figure 8A:
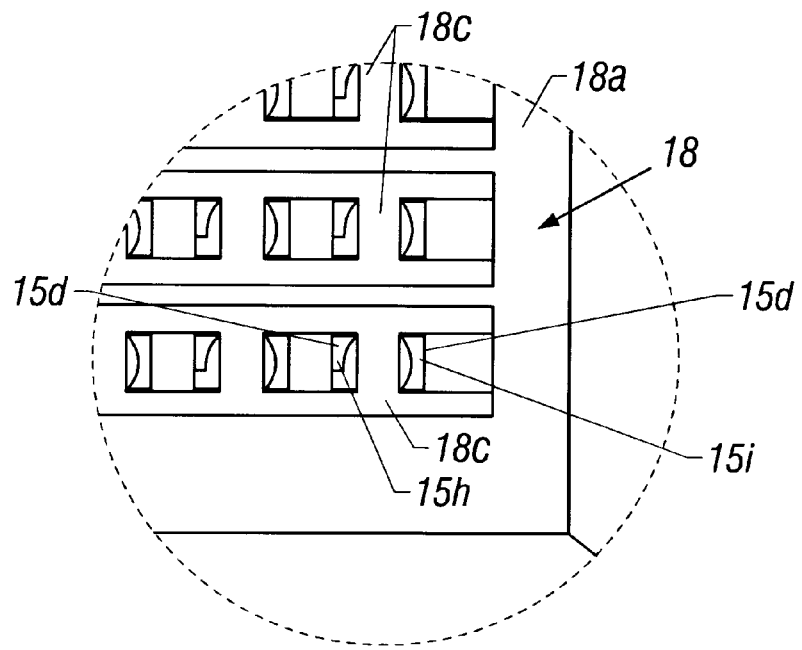
FIG. 8A is an enlarged plan view of a portion "X" of FIG. 1 for showing a state that the pair of contact portions of each of the contact pins is closed.
Figure 8B:
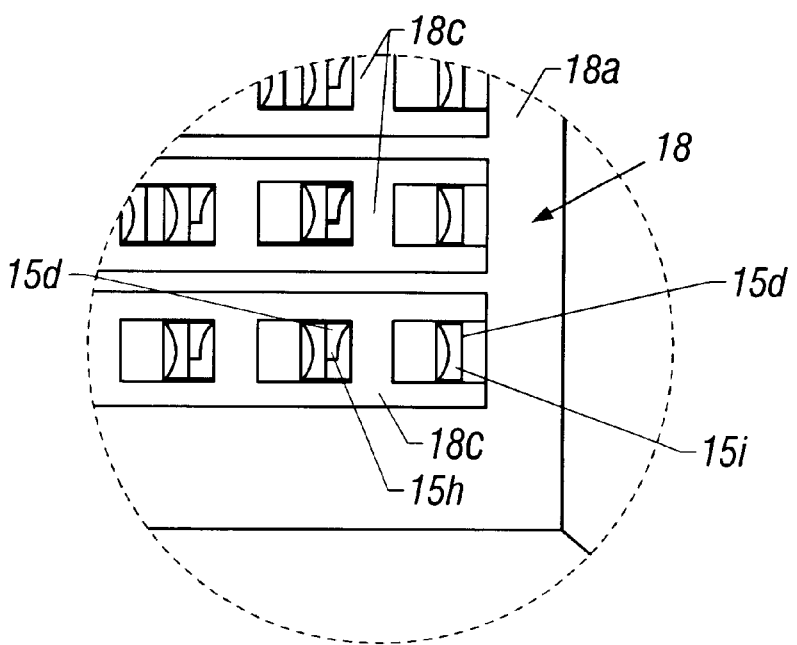
FIG. 8B is an enlarged plan view of the portion "X" of FIG. 1 for showing a state that the pair of contact portions of each of the contact pins is opened.

The displacement of the movable elastic piece 15i due to the elastic deformation makes the paired contact portions 15d of the elastic pieces 15h and 15i open, so that the contact pin 15 is displaced from a state shown in FIGS. 7A and 8A to a state shown in FIGS. 7B and 8B.

Simultaneously with the displacement of the contact pin 15, the press portion 38c of each of the latch members 38 is pressed by the convex portion 19b of the upper operation member 19 so that each of the latch members 38 rotates towards the withdrawal position against the urging force of the spring 39, thereby displacing the hold portion 38b of each of the latch members 38 to the withdrawal position.

In this state, the IC package 12 is mounted on the mount surface 18a of the top plate 18 so as to be guided by the guide portions 18b, thereby being set to the predetermined position on the mount surface 18a. Each solder ball 12b is inserted in the paired contact portions 15d of each contact pin 15 while each solder ball 12b is in non-contact with the paired contact portions 15d thereof.

After the insertion of each solder ball 12b in the paired contact portions 15d, when downward press force applied to the upper operation member 19 is released, the upper operation member 19 moves upward by the urging force of the springs 36, so that the slide plate 17 slides toward the left direction in FIG. 7 by the X-shaped operation link 22, and that each of the latch members 38 rotates towards the mounted IC package 12 by the urging force of the spring 39.

Figure 7C:
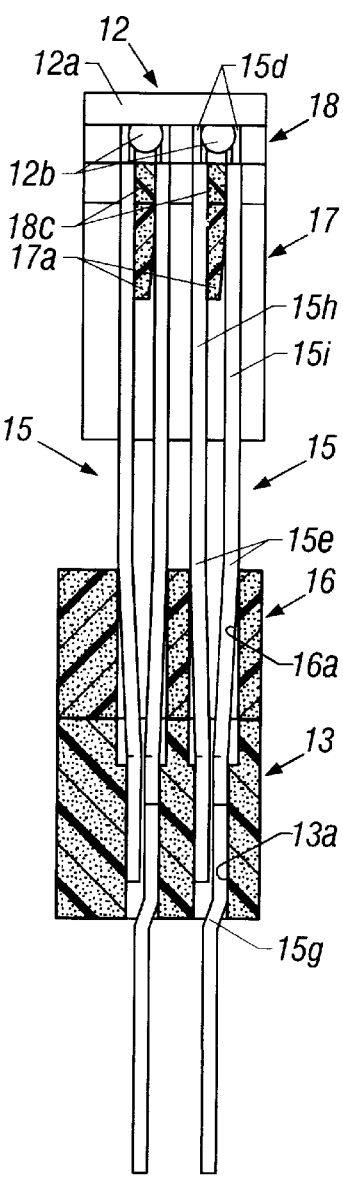
FIG. 7C is a cross sectional view showing a state that a solder ball is clamped so as to be held by the pair of contact portions of each of the contact pins for explaining the operation according to the first embodiment.

When the slide plate 17 is slid toward the left direction as viewed in FIG. 7, a press force applied to the movable elastic piece 15i of the contact pin 15 is released so that the movable elastic piece 15i is getting to return to the original position so that the solder ball 12b is clamped by the contact portion 15d of the movable elastic piece 15i and the contact portion 15d of the stationary elastic member 15h (as referred to FIG. 7C).

As a result, each of the solder balls 12b of the IC package 12 and the printed circuit board mounted on the IC socket 11 are electrically connected through each of the contact pins 15 of the IC socket 11.

On the other hand, in a case of removing the IC package 12 from the IC socket 11, similarly to the mounting operation, by pressing the upper operation member 19 downward, the paired contact portions 15d are apart from the solder ball 12b of the IC package 12 so that it is possible to remove the IC package 12 from the IC socket 11 by weaker force as compared with force required to remove the IC package 12 in which the solder ball 12b is clamped in the paired contact portions 15d.

In the IC socket 11 according to this embodiment, the pre-load plate 16 is arranged for pressing the middle portions of the paired elastic pieces 15h and 15i along the direction (pre-load direction) in that the paired contact portions 15d of the paired elastic pieces 15h and 15i are close to each other so that the paired elastic pieces 15h and 15i are elastically deformed along the pre-load direction, and accordingly, it is possible to set displacement amount (pre-load force) for elastically deforming the elastic pieces 15h and 15i to a desirable amount (desirable force), thereby setting the contact pressure of the paired contact portions 15d of the contact pin 15 with respect to the solder ball 12b as a suitable value.

In addition, the contact pressure of each of the contact pins 15 with respect to each of the solder balls 12b is adapted to be secured by applying the pre-load to each of the contact pins 15 by using the pre-load plate 16, thus making it possible to use the contact pins 15 each having a narrow width needless of using contact pins each having large rigidity.

Therefore, it is possible to produce the IC socket 11 capable of having a structure in which each of the pitches between the respective contact pins 15 is narrow, and to make small the operation force applied to the contact pins 15 by means of the slide plate 17.

As shown in FIG. 6B, since the respective middle portions of the elastic pieces 15h and 15i are bent apart from each other to form the bent portions 15e so that the vertex portions of the bent portions 15e are pressed by the inner wall of the pre-load hole 16a, it is possible to set the pre-load force at the paired contact portions 15d large, as compared with an IC socket having a structure in that the elastic pieces 15h and 15i are parallel to each other.

Furthermore, since the pre-load plate 16 is detachably mounted to the socket body 13 so as to be exchangeable therefrom, it becomes possible to easily change the pre-load force with respect to the contact pin 15 by only exchanging the pre-load plate 16 to another one of pre-load plates 16', wherein each of the pre-load plates 16' is provided with pre-load holes each having a diameter different from the diameter of each pre-load holes of the pre-load plate 16.

As shown in FIGS. 7 and 8, since each of the positioning portions 18c is clamped with the elastic pieces 15h and 15i so as to be positioned, it is possible to locate the paired contact portions 15d at predetermined positions. That is, since the IC package 12 is mounted at the predetermined position on the mount surface 18a of the top plate 18, the IC package 12 and the top plate 18 are arranged so as to have a predetermined positional relationship. Therefore, since the top plate 18 and each of the paired contact portions 15d of each of the contact pins 15 are set to have a predetermined positional relationship by the positioning portions 18c, each of the paired contact portions 15d of the contact pin 15 and each of the solder balls 12b are able to be set to have a predetermined positional relationship. In addition, because the paired elastic pieces 15h and 15i of the contact pin 15 clamp the positioning portion 18c, it is possible to set a center of the contact portions 15d, thereby precisely positioning the contact portions 15d of the contact pin 15.

Still furthermore, when the contact pin 15 is previously pressed with the paired contact portions 15d, as shown in FIG. 7A, since the positioning portion 18c is inserted between the paired contact portions 15d, it becomes possible to prevent each paired contact portions from being interfered.

As shown in FIG. 5, since the base portion 15c is bent so as to have the substantially U-shape in its lateral cross section so that the elastic pieces 15h and 15i are opposite to each other, by pressing one plate member by the press process, it is possible to easily produce the contact pin 15.

Moreover, since the contact pin 15 is, as shown in FIG. 6, formed such that the solder tail portion 15b is bent at the close portion 15g near the bent portion so that the center line O1 of the elastic pieces 15h and 15i coincides with the center line O2 of the solder tail portion 15b, in a case where, for example, the IC package 12 is carried by an automatic machine so as to be set on one of the IC sockets 11 mounted on the printed circuit board, it is convenient that both center lines O1 and O2 are coincided.

That is, the coincidence of both center lines O1 and O2 means that, in view of a top plan side of the IC socket 11 and the IC package 12, each of the arrangement positions of each of the solder balls 12b coincides with each of the through holes of the printed circuit board, because each of the solder balls 12b is inserted between each of the elastic pieces 15h and 15i, and each of the solder tail portions 15b is inserted in each of the through holes of the printed circuit board.

Therefore, in a case where the IC package 12 is carried by the automatic machine with a predetermined position of the printed circuit board being as a reference position, when a positional relationship between the reference position and the through holes of the printed circuit board is grasped, it is possible to set the IC package 12 at the predetermined position on the IC socket 11 mounted on the printed circuit board needless of considering a positional relationship between the printed circuit board and the IC socket 11.

Assuming that the contact pin 15 is formed to be a straight, it is not necessary to especially assert the described merit. However, because the contact pin 15 in this embodiment is formed in that the base portion 15c is bent so that the elastic pieces 15h and 15i are opposite to each other, and the solder tail portion 15b extends downward from the base portion 15c, if the solder tail portion 15b only extends downward, both the center lines O1 and O2 will not coincide with each other.

Thus, in this embodiment, by specifically bending the solder tall portion 15b at the close portion 15g, both of the center lines O1 and O2 coincide with each other, making it possible to gain the described merit.

[Second Embodiment]

FIGS. 10A and 10B show a second embodiment of the present invention.

The second embodiment of the present invention has a structure different from the first embodiment in that a shape of the contact pin 15X of this embodiment is different from that of the contact pin 15 of the first embodiment.

That is, the contact pin 15X of this embodiment is provided with the elastic pieces 15h and 15i which are formed to be tapered towards the upward direction. The upper end contact portions 15d of the elastic pieces 15h and 15i are arranged to be close to each other.

While the paired elastic pieces 15h and 15i of the contact pin 15 is not subjected to any external force, a width HI, between middle portions of the elastic pieces 15h and 15i which is previously pressed by the pre-load plate 16, is wider than a width H2 between the respective contact portions 15d.

Furthermore, the pre-load plate 16 is provided with convex portions 16b in the pre-load holes 16a, respectively. The convex portion 16b is formed on an upper end portion of an inner wall of the pre-load hole 16a so as to project inward. Therefore, in a state that the pair of the elastic pieces 15h and 15i is inserted in the pre-load hole 16a, the convex portion 16b previously presses inward the middle portions of the paired elastic pieces 15h and 15i so that the paired elastic pieces 15h and 15i are elastically deformed, thereby displacing the paired contact portions 15d thereof along the pre-load direction in that a space between the paired contact portions 15d is narrow.

Other structures and operations of this embodiment are substantially similar to those of the first embodiment, so that descriptions of the other structures and operations of this embodiment are omitted herein.

In this second embodiment, similarly to the first embodiment, the middle portions of both elastic pieces 15h and 15i are previously pressed by the convex portion 16b along the pre-load direction so as to elastically be deformed along the pre-load direction, it is possible to achieve the described effects of the first embodiment.

Incidentally, in the first and second embodiments, the present invention is applied to the IC socket for a BGA type IC package, but the present invention is not limited to this application. That is, the present invention may be applied to the IC socket for a PGA (Pin Grid Array) type IC package. In addition, in the first and second embodiments, the "pre-load means" comprises the pre-load plate 16 separated from the socket body 13, but the present invention is not limited to this structure. Namely, "the pre-load means" such as the pre-load plate 16 may be formed on the socket body 13 so as to be integrated therewith. Furthermore, in the above embodiments, the slide plate 17 is arranged to be movable horizontally, but the slide plate 17 may be movable vertically so that, by the vertical movement of the slide plate 17, the paired elastic pieces of the contact pin is made elastically deformable so as to displace the contact portions thereof.

Furthermore, in the above embodiments, the stationary elastic piece 15h and the movable elastic piece 15i are formed on the contact pin 15, but the present invention is applied to the structure in which the movable elastic piece may only be formed on the contact pin 15. Still furthermore, in the first embodiment, the top plate 18 having the mount surface 18a is mounted on the socket body 13, but the present invention is not limited to the structure, and the top plate 18 may be formed on the socket body 13 so as to be integrated therewith. In this structure, the positioning portion is formed on the socket body 13.

[Third Embodiment]

FIG. 11 to FIG. 20 show a third embodiment of the present invention.

The IC socket 111 is also adapted to hold a BGA type IC package (not shown). The IC socket 111 is provided with a socket body 113 mounted on a print circuit board and a plurality of contact pins 114 disposed on the socket body 113 so as to be contacted to or separated from solder balls of the IC package.

The socket body 113 is provided with a base portion 113a having a substantially square shape and a pair of side portions 113b vertically arranged on peripheral sides of a pair of opposite side surfaces of the base portion 113a.

The IC socket 111 is also provided with a center plate 115 as "positioning member", a slide plate 116 as "plate member" and a top plate 117, which are mounted on an upper side of the base portion 113a of the socket body 113 so as to be successively laminated towards an upward direction of the base portion 113a thereof.

The center plate 115, as shown in FIG. 11, has a substantially U-shape in its vertical cross section. That is, the center plate 115 is provided with a plate portion 115a arranged opposite to the base portion 113a of the socket body 113 and a pair of guide members 115b.

The pair of guide members 115b extends downward from a pair of end portions of the plate portion 115a so that the pair of guide members 115b slidably contacts with a pair of inner vertical walls 113c of the pair of side portions 113b. The plate portion 115a, as shown in FIG. 17, for example, is formed with a plurality of positioning holes 115c spaced at pre determined pitches. The contact pins 114 are inserted in the positioning holes 115c so as to be located at predetermined positions defined by the arrangement of the positioning holes 115c.

Since the paired guide members 115b slidably contact the paired inner vertical walls 113c of the paired side portions 113b, the center plate 115 is arranged to be movable along a vertical direction, that is, an extending direction of the contact pin 114.

As shown in FIGS. 11 and 14, two support holes 115d are formed through lower ends of both guide members 115b. Each of the support holes 115d has a predetermined diameter. Moreover, two circular concave portions 113a1 are formed on outer walls of the base portion 113a. Each concave portions 113a1 has the same diameter with the each support hole 115d. When the center plate 115 is located at a predetermined upward position, that is, a predetermined position close to upper end portions (contact portions) 114c of the contact pin 115, the support holes 115d and the concave portions 113a are coaxially arranged. On the other hand, the paired side portions 113b are provided with lock shafts 119. The lock shafts 119 are arranged on the side portions 113b coaxially to the concave portions 113a1 so as to project towards the concave portions 113a1 and to withdraw therefrom.

That is, when the center plate 115 is located at the predetermined upward position so that the support holes 115d and the concave portions 113a1 are coaxially arranged, the lock shafts 119 are penetrated through the support holes 115d so as to fit in the concave portions 113a1, respectively, thereby locking the center plate 115 at the predetermined upward position.

Furthermore, the slide plate 116 is arranged so as to be slidable in a right and left direction (horizontal direction) in FIG. 11. When the slide plate 116 is horizontally slid by a drive unit described hereinafter, the contact pin 114 provided in the socket body 113 is elastically deformed.

Still furthermore, the top plate 117 is mounted on an upper side of the slide plate 116 so as to be fixed to the socket body 113, and, on upper side of the top plate 117, an upper operation member 121 having a square-shaped frame is arranged to be movable along the vertical direction. The upper operation member 121 and the slide plate 116 are mechanically connected through X-shaped links 122 shown in FIGS. 14 and 16. When the upper operation member 121 is moved vertically, the slide plate 117 is slid in the horizontal direction by operations of the X-shaped links 122.

More in detail, the contact pin 114 has an elasticity and is made of a long plate member having a superior conductivity. That is, the contact pin 114 is provided at its upper end with a pair of clamp pieces 114a, 114a. The paired clamp pieces 114a, 114a are formed at its uppermost ends (front ends) with contact portions 114c for clamping the solder balls 12b.

On the other hand, press-fit holes 113d are formed through the base portion 113a of the socket body 113. A lower end portion of the contact pin 114 is pressed to fit in the press-fit hole 113d. The contact pin 114 is provided at its lowermost end with a lead portion 114b so that the lead portion 114b is penetrated through the base portion 113a of the socket body 113 so as to project downward through a bottom (lower) surface of the base portion 113a, as shown in FIG. 11. The projecting lead portion 114b of the contact pin 114 is electrically connected to the printed circuit board.

The paired clamp pieces 114a, 114a of the contact pin 114 projecting upward from an upper surface of the socket body 113 are inserted into the positioning hole 115c of the center plate 115 and through holes 116a and 117a of the slide plate 116 and the top plate 117.

One of the paired clamp pieces 114a of the contact pin 114, although a detailed description is omitted, is pressed by a press portion of the slide plate 116 so as to be elastically deformed so that the one of the paired clamp pieces 114a of the contact pin 114 is far from a side of the solder ball. In addition, the other one of the paired clamp pieces 114a is not pressed by the slide plate 116 but elastically contacts with the solder ball. That is, both of the paired elastic pieces 114a of the contact pin 114 contact with both sides of the solder ball so as to clamp it.

Furthermore, the top plate 117 has a square shape and the IC package is mounted on a mount surface (top surface) of the top plate 117. The top plate 117 is provided with the through holes 117a into which the solder balls are inserted.

As shown in FIG. 11 and the like, the top plate 117 has guide portions 117b for arranging the IC package 12 to a predetermined position. The guide portions 117b are mounted on the mount surface of the top plate 117 at four portions corresponding to the corner portions of the IC package, respectively. Each of the guide portions 117b projects upward from the mount surface of the top plate 117.

On the other hand, the upper operation member 121, as shown in FIGS. 11 and 12, is provided with an opening 121a having a predetermined area which allows the IC package to be inserted therein. The IC package is inserted through the opening 121a so as to be mounted on the mount surface of the top plate 117, in which the IC package is located at the predetermined position defined by the guide portions 117b.

The upper operation member 121 is arranged to be movable vertically with respect to the socket body 113 and is urged upward by springs 124 inserted between the upper operation member 121 and the socket body 113.

The X-shaped links 122 are disposed at positions corresponding to both the side surface portions of the square-shaped slide plate 116, wherein the both side surfaces are arranged along the slide direction of the slide plate 116.

More concretely, the X-shaped link 122, as shown in FIGS. 14 and 16, is provided with a first link member 123 and a second link member 125 each having the same length. The first link member 123 and the second link member 125 are rotatably joined by a center joint pin 127.

The first link member 123 is provided with a lower end portion 123a, and the lower end portion 123a is pivotally joined to the socket body 113 by a lower end joint pin 129. The second link member 125 has a lower end portion 125a, and the slide plate 116 has one end portion along the slide direction thereof. The lower end portion 125a of the second link member 125 is rotatably joined to the one end portion of the slide plate 116 by a lower end joint pin 130. Upper end portions 123b and 125b, that is, other end portions opposite to the one end portions 123a and 125a of the first and second link members 123 and 125 are joined to the upper operation member 121 by upper joint pins 133 and 134, respectively. The first link member 123 is formed at its upper end portion 123b with a slot 123c so that the first link member 123 is joined through the slot 123c to the upper operation member 121 by the upper joint pin 133.

Furthermore, in the socket body 113, a pair of latch members 136 is disposed through a shaft (shaft pin) 136a to the socket body 113 to be rotatable about the shaft 136a. The latch members 136 are arranged opposite to each other through the mount surface of the top plate 117. The latch member 136 is rotatable towards a peripheral side portion of the IC package mounted at the predetermined position on the top plate 117 so as to hold the peripheral side portion thereof. In addition, the latch member 136 is rotatable apart from the peripheral side portion of the mounted IC package so as to be withdrawal therefrom to a predetermined withdrawal position.

The latch member 136 is urged by a spring 137 towards the peripheral side portion of the mounted IC package.

The upper operation member 121 is formed with a projection portion 121b so that, when the upper operation member 121 is moved downward, the projection portion 121b slidably contacts the latch member 136 so as to rotate the latch member 136 towards the withdrawal position.

Next, a method of assembling the IC socket 111 will be described hereunder.

At first, previously, the center plate 115 is fitted in the socket body 113, as shown in FIG. 11, and the center plate 115 is set at a predetermined downward position under the predetermined upward position, wherein the center plate 115 is located onto the base portion 113a, as shown in FIGS. 17 and 18.

When the center plate 115 is set at the predetermined downward position, the contact pins 114 are inserted into the positioning holes 115c so as to be pressed to fit in the press-fit holes 113d, respectively. Thus, the plurality of contact pins 114 are arranged in position on the center plate 115 and the socket body 113. In a state that positions of the contact pins 114 are arranged on the center plate 115 and the socket body 113, the upper end portions of the paired clamp pieces 114a, 114a of the respective contact pins 114 may be different from the predetermined positions defined by the arrangement of the positioning holes 115c, as referred to FIG. 18.

Next, as shown in FIG. 19, the center plate 115 is moved upward toward the upper end side of the contact pin 114 so as to be set at the predetermined upward position. When the center plate 115 is set at the predetermined upward position, the lock shafts 119 are penetrated through the support holes 115d so as to fit in the concave portions 113a1, respectively, thereby locking the center plate 115 at the predetermined upward position.

While the center plate 115 is locked at the predetermined upward position, the paired contact portions 114c of the paired clamp pieces 114a of the contact pin 114 is located at the predetermined positions by the positioning hole 115c of the center plate 115.

After the position of each contact portion 114c is decided, the paired clamp pieces 114a are integrally inserted into the through hole 116a of the slide plate 116 so that the slide plate 116 is arranged to be horizontally movable. The paired contact portions 114c projecting upward through the slide plate 116 are inserted into the through hole 117a of the top plate 117, so that the top plate 117 is arranged (as referred to FIG. 20).

In this embodiment, when pressing the contact pin 144 to fit into the press-fit hole 113d, the center plate 115 is located at the predetermined downward position so that the positioning hole 115c of the center plate 115 is close to the press-fit hole 113d of the socket body 113, making it possible to simultaneously carry out the insertion of the contact pin 144 into the positioning hole 115c and the press-fit hole 113d. As a result, the efficiency of an arrangement work of the contact pins 144 can be improved. Furthermore, when assembling the slide plate 116 and the top plate 117 to the socket body 113, the center plate 115 is moved upward so as to be located at the predetermined upward position in which the center plate 115 is close to the upper end portions of each of the contact pins 144, making it possible to precisely position the contact portions 144c of each of the contact pins 144.

Therefore, because the contact portions 144c of each of the contact pins 144 are precisely positioned, it is possible to easily insert each of the contact portions 144c of each of the contact pins 144 into each of the through holes 116a and 117a of the slide plate 116 and the top plate 117, thereby improving efficiency of an assembling work of each of the plates 116 and 117.

[Fourth Embodiment]

FIG. 21 to FIG. 29 show a fourth embodiment of the present invention.

The IC socket 114 is provided with a socket body 143 mounted on a print circuit board. The socket body 143 is provided with a base portion 144 having a substantially square shape and a square-shaped inner hollow portion. The socket body 143 is also provided with a press-fit plate 145 having a bottom plate member 145a and a peripheral plate member 145b. The bottom plate member 145a has a substantially square shape and arranged in the inner hollow portion of the base portion 144. The peripheral plate member 145b is provided with an upper plate portion 145b1 having a substantially square shape and a square-shaped inner hollow portion and mounted on the base portion 144. The peripheral plate member 145b is also provided with a pair of side portions 145b2 extending inner peripheral lower end portions thereof and vertically arranged on peripheral sides of a pair of opposite side surfaces of the bottom plate member 145a.

That is, the press-fit plate 145 is arranged on the base portion 144 so that the paired side portions 145b2 are pressed to fit in the inner hollow space of the base portion 144 and the upper plate portion 145b1 is mounted on the base portion 144.

On the other hand, press-fit holes 145c are formed through the bottom plate member 145a of the press-fit plate 145, and the upper plate portion 145b1 of the press-fit plate 145 is fixed to the base portion 144 by bolts 147.

The contact pin 146 is provided at its upper end with a pair of clamp pieces 146a. The paired clamp pieces 146a are formed at its uppermost ends (front ends) with contact portions 146b for clamping the solder balls of the printed circuit board so as to hold them. While the paired clamp pieces 146a, which is being inserted into the socket body 143, are not subjected to any external force, the paired contact portions 146b of the paired elastic pieces 146a are opened. That is, lower end portions of the paired clamp pieces 146a are close to each other but the contact portions 146b thereof are separated from each other at a predetermined space.

Moreover, the IC socket 141 is also provided with a center plate 148 as "positioning member" arranged between the bottom plate member 145a and the paired side portions 145b2 of the peripheral plate member 145b. The center plate 148 is adapted to be movable along the vertical direction, that is, an extending direction of the contact pin 146.

The center plate 148, similarly to the third embodiment, is provided with a plate portion 148a and a pair of guide members 148b constituting a substantially U-shape in its vertical cross section. The plate portion 148a is provided with a plurality of positioning holes 148c. The positioning holes 148c are formed by peripheral walls 148e of the plate portion 148a so as to be spaced at predetermined pitches. The contact pins 146 are adapted to be inserted in the positioning holes 148c of the center plate 148.

Similarly to the third embodiment, two support holes 148d are formed through lower ends of both guide members 148b.

Two circular concave portions 145a1 are formed on outer walls of the bottom plate member 145a. When the center plate 148 is located at a predetermined upward position close to the contact portions 146b of the contact pin 146, the support holes 148d and the concave portions 145a1 are coaxially arranged. On the other hand, the paired side portions 145b2 are provided with lock shafts 119. The lock shafts 119 are arranged on the side portions 145b2 coaxially to the concave portions 145a1 so as to project towards the concave portions 145a1 and to be withdrawal therefrom.

Namely, when the center plate 148 is located at the predetermined upward position, the lock shafts 119 are penetrated through the support holes 148d so as to fit in the concave portions 145a1, respectively, thereby locking the center plate 148 at the predetermined upward position.

The center plate 148 is moved towards the paired contact portions 146b of the contact pin 146 so that the paired clamp pieces 146a are elastically deformed toward a closing direction (a direction close to each other), thereby closing the contact portions 146b thereof.

A slide plate 149 is arranged on an upper side of the center plate 148. The slide plate 149 is formed with press portions 149a each of which is inserted between the paired clamp pieces 146a of each of the contact pins 149.

The upper operation member 121 and the slide plate 149 are mechanically connected through X-shaped links 122, similarly to the third embodiment. When the upper operation member 121 is moved downward, the slide plate 149 is slid in a right direction in FIGS. 21 and 22 by operations of the X-shaped links 122 so that the slide plate 149 displaces from a state of the slide plate 149 shown in FIG. 21 to a state thereof shown in FIG. 22. By the sliding of the slide plate 149, one of the paired clamp pieces 146a of the contact pin 146 is pressed by the press portion 149a of the slide plate 149 so as to be elastically deformed such that the one of the paired clamp pieces 146a of the contact pin 146 is separated from the other thereof, thereby opening the paired contact portions 146b of the paired clamp pieces 146a.

Incidentally, an illustration of a top plate according to this embodiment is omitted in FIGS. 21 to 29.

Next, a method of assembling the IC socket 141 will be described hereunder.

At first, previously, the center plate 148 is fitted in the press-fit plate 147, and the center plate 148 is set at a predetermined downward position under the predetermined upward position, wherein the center plate 148 is located onto the bottom plate member 145a, as shown in FIG. 23.

When the center plate 148 is set at the predetermined downward position, the contact pins 146 are inserted into the positioning holes 148c of the center plate 148 so as to be pressed to fit in the press-fit holes 145a of the press-fit plate 145, respectively. Thus, the plurality of contact pins 146 are arranged on the center plate 148 and the press-fit plate 145. In a state that positions of the contact pins 146 are arranged on the center plate 148 and the press-fit plate 145, the paired clamp pieces 146a of each contact pin 146 are opened so as to be separated from each other, as referred to FIG. 24.

Next, as shown in FIG. 25, the slide plate 149 is arranged to be slidable on the upper side of the center plate 148 so that the press portions 149a of the slide plate 149 are inserted between the paired clamp pieces 146a, respectively, as shown in FIG. 27.

As described above, when assembling (arranging) the slide plate 149 on the upper side of the center plate 148, because the paired clamp pieces 146a of each of the contact pins 149 are opened, it is possible to easily insert each of the press portions 149a of the slide plate 149 between the paired clamp pieces 146a of each of the contact pins 146, thereby easily carrying out the assembling work of the slide plate 149 to the socket body 143.

Thereafter, as shown in FIG. 26, the center plate 148 is moved upward towards the upper end side of the contact pin 146. While the center plate 148 is moved upward towards the upper end side of the contact pin 146, the peripheral wall 148e defining the positioning hole 148c presses the paired clamp pieces 146a so as to elastically deform the same towards the closing direction, as referred to FIGS. 28 and 29. According to the elastically deformation of the paired clamp pieces 146a toward the that direction, the press portion 149a inserted between the paired clamp pieces 146a is clamped so that the paired contact portions 146b of the paired clamp pieces 146a are located at predetermined positions while being closed.

After each of the paired contact portions 146b of each of the contact pins 146 is located at each of the predetermined positions, each of the paired contact portions 146b is inserted in each through hole formed through the top plate, which is not shown.

In this embodiment, since each of the contact portions 146b is located at each of the predetermined positions, it is possible to easily insert each of the contact portions 146b into each of the through holes of the top plate, thereby improving assembling work efficiency of the top plate.

In addition, the elastically deformation of the paired clamp pieces 146a towards the closing direction by the upward movement of the center plate 148 causes the contact pin 146 to be subjected to a pre-load so that a contact pressure with respect to the solder ball of the IC package can be secured and a clamp piece having low rigidity as the clamp piece 146a itself becomes usable. When using the clamp piece 146a having low rigidity, for example the clamp piece 146a having a narrow width, it is possible to make the whole of the contact pin 146 thin and compact, thereby producing the IC socket 141 having a structure in which each of the pitches between the respective contact pins 146 is narrow.

Other structures and operations of this embodiment are substantially similar to those of the third embodiment, so that descriptions of the other structures and operations of this embodiment are omitted herein.

In the third and fourth embodiments, the present invention is applied to an open-top type IC socket, but the present invention is not limited to the application. That is, the present invention may be applied to a clamshell type IC socket.

The clamshell type IC socket is provided with a socket body and a cover mounted on the socket body so as to open and close. A floating plate as a plate member on which the IC package is mounted is arranged through a spring on the socket body so as to be movable vertically. A press member is disposed to the cover for pressing the IC package from an upper side thereof.

Moreover, a plurality of contact pins are pressed to fit in the socket body. A plurality of through holes are formed through the floating plate. Each of the contact pins is provided, at its upper end, with a contact portion so that each of the contact portions is inserted in each of the through holes of the floating plate.

In the clamshell type IC socket, when arranging the floating plate, there is a need of inserting each contact portion of the contact pin into the through hole of the floating plate. However, in the clamshell type IC socket to which the present invention is applicable, the center plate 148 is moved upward towards the upper end side of each contact pin 146 so that the paired contact portions of each contact pin are located at predetermined positions, making it possible to improve an assembling efficiency of the floating plate.

Incidentally, in the third and fourth embodiments, the present invention is applied to the IC socket for a BGA type IC package as "electrical part", but the present invention is not limited to the application.

That is, the present invention may be applied to the IC socket for an IC package having a plurality of terminals arranged as an array, or an electrical part except for the IC package.

Furthermore, in the third and fourth embodiments, the center plates 115, 148 are moved upward at the predetermined upward positions, so that the contact pins 114, 146 are located at the predetermined positions, and while the center plates 115, 148 located at the predetermined upward positions are locked, the IC socket is used. However, after the contact pins 114, 146 are located at the predetermined positions and the slide plates 116, 149 are assembled on the upper side of the contact pins 114, 146, it may be possible to move downward the center plates 116, 149 at, for example, the predetermined downward portions.

Incidentally, in the above first to fourth embodiments, the present invention is applied to an IC socket as "socket for electric parts", but the present invention is not limited to the application. It is possible to apply the present invention to a socket for other electrical parts.

While there has been described what is at present considered to be the preferred embodiments and modifications of the present invention. It will be understood that various modifications which are not described yet may be made therein, and it is intended to cover in the appended claims all such modifications as fall within the true spirit and scope of the invention.

What is claimed is:

1. A socket for an electrical part, the socket comprising:
   a socket body having a mount portion on which an electrical part is mounted, said electrical part having terminals;
   a plurality of contact pins arranged to the socket body and adapted to be contacted to or separated from the terminals of the electrical part, respectively;
   a movable plate disposed to the socket body so as to be movable with respect to the socket body,
   each of said contact pins having a moveable elastic piece and an opposing stationary elastic piece, the moveable elastic piece being formed at a front end portion thereof with a contact portion, said contact portion being displaced relative to the stationary elastic piece in accordance with the movement of the movable plate so as to contact the terminal of the electrical part thereby being electrically connected thereto; and
   means, fixed relative to the socket body, for continuously applying a constant preload to each middle portion of each contact pins' elastic piece, said means arranged to the socket body so as to elastically deform the middle portion of the elastic piece in a direction for closing, relative to the opposing stationary portion, the contact portion of the contact pins to contact the terminal of the electrical part, wherein at the time the electrical part is mounted on the socket said elastic pieces are deformed elastically against said preload by displacement of the movable plate so as to elastically displace the contact portion of the contact pin from an original position thereof.

2. A socket for an electrical part according to claim 1, wherein said means comprises a press plate having one or more holes into each of which the middle portion of the elastic piece is inserted, said press plate being mounted on the socket body, while the middle portion of the elastic piece is inserted in the press hole, and wherein each of said one or more press plate holes presses the middle portion of the elastic piece so as to elastically deform the middle portion thereof.

3. A socket for an electrical part according to claim 2, wherein said press plate is detachably mounted on the socket body.

4. A socket for an electrical part according to claim 1, wherein said means is mounted on the socket body so as to be integrated thereto.

5. A socket for an electrical part, the socket comprising:
   a socket body having a mount portion on which an electrical part is mounted, said electrical part having terminals;
   a plurality of contact pins arranged to the socket body and adapted to be contacted to or separated from the terminals of the electrical part, respectively;
   a movable plate disposed to the socket body so as to be movable with respect to the socket body,
   each of said contact pins having a pair of elastic pieces formed at front end portions thereof, each elastic piece having a contact portion opposing another contact portion of the elastic piece pair, each pair of opposing contact portions being opened or closed in accordance with movement of the movable plate so as to clamp the terminals of the electrical part thereby being electrically connected thereto; and
   means, fixed relative to the socket body, for continuously applying a constant preload to a middle portion of each elastic piece, said means arranged to the socket body so as to elastically deform the middle portion of the elastic piece in a direction in which the paired contact portions are urged towards each other, wherein at the time the electrical part is mounted on the socket said elastic pieces are deformed elastically against said preload by displacement of the movable plate so as to elastically displace the contact portion of the contact pin from an original position thereof.

6. A socket for an electrical part according to claim 5, wherein said middle portions of the paired elastic pieces pressed by said means are formed to be apart from each other at a first predetermined interval while the paired elastic pieces are not subjected to any external force, ad said contact portions of the paired elastic pieces are formed to be apart from each other at a second predetermined interval, said first predetermined interval being wider than the second predetermined interval.

7. A socket for an electrical part according to claim 6, wherein each of said paired elastic pieces is provided with a bent portion, the bent portions of the paired elastic pieces are formed at the respective middle portions thereof so that the respective middle portions are bent apart from each other, thereby forming vertex portions of the respective middle portions and said vertex portions of the bent portions are pressed by said means, respectively.

8. A socket for an electrical part according to claim 5, wherein said paired elastic pieces are formed at lower ends with a base portion so that the paired elastic pieces are integrated by the base portion and said base portion is bent so that the paired elastic pieces are opposite to each other.

9. A socket for an electrical part according to claim 5, wherein said paired elastic pieces are formed at lower ends with a base portion so as to be integrated by the base portion, each of said contact pins is provided with a solder tail portion extending from the base portion so as to be connected to a printed circuit board, and said solder tail portion is formed so that a center line between the paired elastic pieces coincides with a center line of the solder tail portion.

10. A socket for an electrical part according to claim 5, wherein said means comprises a press plate having press holes in which the middle portions of the elastic pieces are inserted, said press plate being mounted on the socket body, while the middle portions of the elastic pieces are inserted in the press holes, respectively, and said press plate holes presses the middle portions of the elastic pieces so as to elastically deform the middle portions.

11. A socket for an electrical part according to claim 10, wherein said press plate is detachably mounted on the socket body.

12. A socket for an electrical part according to claim 5, wherein said means is mounted on the socket body so as to be integrated thereto.

13. A socket for an electrical part, the socket comprising:
   a socket body having a mount portion on which an electrical part is mounted, said electrical part having terminals;
   a plurality of contact pins arranged to the socket body and adapted to be contacted to or separated from the terminals of the electrical part, respectively;
   a movable plate disposed to the socket body so as to be movable with respect to the socket body, each of said contact pins having a pair of elastic pieces formed at front end portions thereof, each elastic piece having a contact portion opposing another contact portion of the elastic piece pair, each pair of opposing contact portions being opened or closed in accordance with movement of the movable plate so as to clamp a terminal of the electrical part, thereby being electrically connected thereto; and a positioning member arranged close to each of the paired contact portions of each o the paired elastic pieces, each of said positioning members being clamped by the paired elastic pieces and adapted to locate the paired contact portions at a predetermined position.

14. A socket for an electrical part according to claim 13, further comprising a top plate mounted on the socket body, said mount portion being formed on the top plate, and wherein said movable plate is arranged below the top plate.

15. A socket for an electrical part according to claim 13, further comprising means for pressing a middle portion of each of the elastic pieces of each of the contact pins arranged to the socket body so as to elastically deform the middle portion thereof along a direction in that the paired contact portions are contacted to the terminals of the electrical part, respectively.

16. A socket for an electrical part according to claim 15, wherein said middle portions of the paired elastic pieces pressed by said means for pressing are formed to be fair from each other at a first predetermined interval while the paired elastic pieces are not subjected to any external force, and said contact portions of the paired elastic pieces are formed to e apart from each other at a second predetermined interval, said first predetermined interval being wider than the second predetermined interval.

17. A socket for an electrical part according to claim 16, wherein said the paired elastic pieces are formed to be tapered towards the contact portion thereof so that the contact portions of the paired elastic pieces are close to each other.

18. A socket for an electrical part, the socket comprising:
    a socket body having a mount portion on which an electrical part is mounted, said electrical part having terminals;
    a plurality of contact pins arranged to the socket body as an array and pressed to fit in the socket body, each of said contact pins having a front end portion;
    a plate member mounted on the socket body, said plate member having a plurality of holes into which the contact pins are inserted respectively, said front end portions of the contact pins being contacted to or separated from the terminals of the electrical part, respectively; and
    a positioning member disposed to the socket body to be movable along an extending direction of the contact pin, said positioning member having a plurality of positioning holes into which the contact pins are inserted, respectively,
    wherein, after the contact pins are fitted in the socket body, said positioning member is moved toward a front end side of each of the contact pins so as to permit each of the front end portions of each of the contact pins inserted in each of the positioning holes to be located at a predetermined position.

19. A socket for an electrical part according to claim 18, wherein each of said contact ins has a pair of clamp pieces formed at front end portions thereof, each clamp piece having a contact portion opposing another contact portion of the clamp piece pair, each pair of opposing contact portions clamping a terminal of the electric part, when the contact pins are pressed to fit in the socket body, each of said paired contact portions of each of the paired clamp pieces is opened, and wherein each of said paired contact portions is elastically deformed towards a direction in that each of the paired contact portions is closed in accordance with the movement of the positioning member towards the contact end side of each of the contact pins.

20. A socket for an electrical part according to claim 19, wherein said plate member is adapted to be movable with respect to the socket body, each of said contact portions of each of the paired clamp pieces being opened or closed in accordance with the movement of the plate member so as to clamp each of the terminals of the electrical part, thereby being electrically connected thereto.

21. A socket for an electrical part according to claim 20, further comprising a top plate having a number of through holes and mounted on the socket body so that the paired contact portions are inserted in the through holes of the top plate, respectively, said mount portion being formed on the top plate.

22. A method of assembling a socket having a socket body for an electrical part, the method comprising:
    preparing a positioning member having a plurality of positioning holes, a plurality of contact pins each having a pair of clamp pieces formed at front end portions thereof, each clamp piece having a contact portion opposing another contact portion of the clamp piece pair, a plate member having a plurality of press portions and a top plate having a mount portion on which an electrical part is mounted and a number of through holes;
    disposing the positioning member to the socket body so as to be movable with respect to the socket body;
    inserting the contact pins in the positioning holes so as to press the contact pins to fit in the socket body;
    inserting said press portions of the plate member in spaces between the paired elastic pieces so as to arrange the plate member on the socket body, said plate member being slidable horizontally with the socket body, said paired contact portions of each of the paired elastic pieces being opened or closed in accordance with the movement of the plate member;
    moving the positioning member towards the contact portion side of each of the contact pins so as to elastically deform the paired elastic pieces thereby closing the paired contact portions so that the press portions of the plate member are clamped by the paired contact portions, respectively; and
    inserting the closed contact portions in the through holes of the top plate so as to arrange the top plate on the socket body.

* * * * *